(12) United States Patent
Ozawa et al.

(10) Patent No.: US 10,938,382 B2
(45) Date of Patent: Mar. 2, 2021

(54) ELECTRONIC CIRCUIT AND ELECTRONIC DEVICE

(71) Applicant: SONY SEMICONDUCTOR SOLUTIONS CORPORATION, Kanagawa (JP)

(72) Inventors: Osamu Ozawa, Tokyo (JP); Takahiro Naito, Kanagawa (JP); Tatsuo Kuroiwa, Kanagawa (JP); Kenichi Tayu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/473,881

(22) PCT Filed: Dec. 19, 2017

(86) PCT No.: PCT/JP2017/045435
§ 371 (c)(1),
(2) Date: Jun. 26, 2019

(87) PCT Pub. No.: WO2018/146947
PCT Pub. Date: Aug. 16, 2018

(65) Prior Publication Data
US 2019/0356305 A1 Nov. 21, 2019

(30) Foreign Application Priority Data
Feb. 8, 2017 (JP) .............................. JP2017-021122

(51) Int. Cl.
*H03K 5/1252* (2006.01)
*G05F 3/24* (2006.01)
(Continued)

(52) U.S. Cl.
CPC ............. *H03K 5/1252* (2013.01); *G05F 3/24* (2013.01); *H01L 27/0222* (2013.01); *H03K 17/687* (2013.01)

(58) Field of Classification Search
None
See application file for complete search history.

(56) References Cited

U.S. PATENT DOCUMENTS 6,084,391 A 7/2000 Onodera
8,928,109 B2* 1/2015 Ishihara .............. H01L 27/0292
257/328

(Continued)

FOREIGN PATENT DOCUMENTS

CN 1238483 A 12/1999
CN 101399264 A 4/2009
(Continued)

OTHER PUBLICATIONS

International Search Report and Written Opinion of PCT Application No. PCT/JP2017/045435, dated Feb. 13, 2018, 09 pages of ISRWO.

*Primary Examiner* — Cassandra F Cox
(74) *Attorney, Agent, or Firm* — Chip Law Group

(57) ABSTRACT

An electronic circuit according to one aspect of the present technology includes an MOS circuit portion and a stabilizing element portion. The MOS circuit portion includes a deep well. The stabilizing element portion includes a first element portion arranged between a power supply source and the deep well, and stabilizes a potential of the deep well.

16 Claims, 11 Drawing Sheets

(51) Int. Cl.
*H01L 27/02* (2006.01)
*H03K 17/687* (2006.01)

(56) References Cited

U.S. PATENT DOCUMENTS

| | | |
|---|---|---|
| 2003/0234427 A1 | 12/2003 | Kono |
| 2008/0285187 A1 | 11/2008 | Van Camp et al. |
| 2011/0057705 A1 | 3/2011 | Tahata |
| 2012/0319228 A1 | 12/2012 | Ishihara et al. |
| 2017/0300797 A1 | 10/2017 | Yamamoto |

FOREIGN PATENT DOCUMENTS

| | | |
|---|---|---|
| CN | 102013413 A | 4/2011 |
| CN | 105637786 A | 6/2016 |
| DE | 19927007 A1 | 12/1999 |
| EP | 2535934 A1 | 12/2012 |
| JP | 11-353045 A | 12/1999 |
| JP | 2004-031411 A | 1/2004 |
| JP | 2008-288592 A | 11/2008 |
| JP | 2009-049872 A | 3/2009 |
| JP | 2011-060876 | 3/2011 |
| JP | 2011-060876 A | 3/2011 |
| JP | 2013-004644 A | 1/2013 |
| JP | 2014-149692 A | 8/2014 |
| TW | 201612797 A | 4/2016 |
| WO | 2016/046892 A1 | 3/2016 |

\* cited by examiner

ELECTRONIC CIRCUIT AND ELECTRONIC DEVICE

CROSS REFERENCE TO RELATED APPLICATIONS

This application is a U.S. National Phase of International Patent Application No. PCT/JP2017/045435 filed on Dec. 19, 2017, which claims priority benefit of Japanese Patent Application No. JP 2017-021122 filed in the Japan Patent Office on Feb. 8, 2017. Each of the above-referenced applications is hereby incorporated herein by reference in its entirety.

TECHNICAL FIELD

The present technology relates to an electronic circuit including a metal-oxide-semiconductor (MOS) circuit, and an electronic device.

BACKGROUND ART

In the related art, an MOS circuit including an N-type (a P-type) MOS transistor, a complementary MOS (CMOS) transistor, or the like is widely used. For example, in Patent Literature 1, a voltage current conversion circuit is described in which an NMOS transistor is used as an input transistor. In the input transistor, a substrate region P-sub and a well region of the transistor are insulated by using a deep N-type well layer. Then, a back gate voltage of the well region is controlled independently from the voltage of the substrate region P-sub, and thus, an output current range with respect to an input voltage range can be controlled. A potential is applied to the deep N-type well layer through a deep well terminal, but the details of the potential are not described (Specification Paragraphs [0014], [0019], [0020], and [0024], FIGS. 1, 2, and the like in Patent Literature 1).

CITATION LIST

Patent Literature

Patent Literature 1: JP-A-2009-49872

SUMMARY OF INVENTION

Technical Problem

Recently, a small device such as a mobile device, a wearable device, and an internet of things (IoT) device has been widely used, and a reduction in the power consumption of the device has progressed. There are many cases where the MOS circuit including a deep well as described above is mounted. A circuit that is operated by a minute current is easily affected by an exogenous noise, and thus, a technology for improving noise resistance has been required.

In consideration of the circumstances described above, an object of the present technology is to provide an electronic circuit and an electronic device having excellent noise resistance in a device on which an MOS circuit including a deep well is mounted.

Solution to Problem

In order to attain the object described above, an electronic circuit according to one aspect of the present technology, includes: an MOS circuit portion; and a stabilizing element portion.

The MOS circuit portion includes a deep well.

The stabilizing element portion includes a first element portion which is arranged between a power supply source and the deep well, and stabilizes a potential of the deep well.

In the electronic circuit, it is possible to fix the potential of the deep well to a desired potential by the stabilizing element portion which includes the first element portion arranged between the power supply source and the deep well of the MOS circuit portion. Accordingly, for example, it is possible to prevent the flow of an unnecessary current by applying a forward potential to a parasite diode between the deep well and the other well. The potential of the deep well is not directly connected to the power supply source, and thus, it is possible to decrease a fluctuation in the potential of the deep well even in a case in which there is a power source noise, and it is possible to improve noise resistance.

The MOS circuit portion may include a CMOS circuit which includes a deep N-type well.

Accordingly, it is possible to improve noise resistance of a device on which the CMOS circuit is mounted.

The MOS circuit portion may be operated in a subthreshold region.

Accordingly, it is possible to sufficiently decrease a current that flow the MOS circuit portion. As a result thereof, noise resistance is a concern in a low power consumption device, but it is possible to improve power source noise resistance according to this configuration.

The electronic circuit may be operated by a current approximately greater than or equal to 1 nA and less than or equal to 100 nA.

Accordingly, it is possible to suppress a malfunction due to a power source noise, even in a device which is operated by a current of a nanoampere level.

The stabilizing element portion may apply a predetermined voltage to the deep well.

Accordingly, for example, it is possible to retain the deep well at a predetermined potential. As a result thereof, it is possible to sufficiently improve the noise resistance of the device.

The first element portion may include any one or an arbitrary combination of a resistance, a capacitor, a transistor, and an inductor.

Accordingly, it is possible to easily configure the first element portion by using each circuit element.

The MOS circuit portion may include a P-type substrate on which the deep N-type well is formed, and a P-type well which is electrically separated from the P-type substrate by the deep N-type well. In this case, the stabilizing element portion may retain a potential of the deep N-type well at a value greater than or equal to a potential of the P-type well.

Accordingly, it is possible to prevent the flow of an unnecessary current between the deep N-type well and the P-type well, and it is possible to stabilize the operation of the MOS circuit portion. As a result thereof, it is possible to improve the noise resistance of the device.

The MOS circuit portion may include an NMOS transistor which is formed in the P-type well. In this case, the stabilizing element portion may include a wiring portion which connects the deep N-type well to any one of a gate, a source, and a drain of the NMOS transistor, and sets the potential of the deep N-type well to a potential identical to any one of a gate potential, a source potential, and a drain potential of the NMOS transistor.

Accordingly, it is possible to easily stabilize the potential of the deep N-type well by using each potential of the NMOS transistor.

The MOS circuit portion may include a plurality of P-type wells which is electrically separated from the P-type substrate by the deep N-type well, and a plurality of NMOS transistors which is respectively formed in the plurality of P-type wells. In this case, the stabilizing element portion may include a wiring portion which connects the deep N-type well to any one of a gate, a source, and a drain of a predetermined NMOS transistor in the plurality of NMOS transistors, and sets the potential of the deep N-type well to a potential identical to any one of a gate potential, a source potential, and a drain potential of the predetermined NMOS transistor.

Accordingly, it is possible to easily improve noise resistance of the plurality of NMOS transistors provided in the deep N-type well by using each potential of the predetermined NMOS transistor.

The stabilizing element portion may be a band gap reference (BGR) circuit.

Accordingly, it is possible to sufficiently stabilize the potential of the deep well by using a stable voltage such as a bandgap voltage.

The stabilizing element portion may be a voltage circuit which generates a voltage based on a ground.

Accordingly, it is possible to sufficiently stabilize the potential of the deep well by using the voltage based on the ground.

The voltage circuit may include an NMOS transistor which is operated in a subthreshold region.

Accordingly, for example, it is possible to realize a voltage circuit having a small change in a voltage with respect to a change in a current and the like. As a result thereof, it is possible to sufficiently stabilize the potential of the deep well.

The stabilizing element portion may include a second element portion which is arranged between a ground and the deep well.

Accordingly, for example, the potential of the deep well is not directly connected to a ground (GND), and thus, it is possible to sufficiently decrease a fluctuation in the potential of the deep well even in a case in which there is a GND noise and the like. In addition, for example, it is possible to set the potential of the deep well on the basis of the ground, and thus, it is possible to stabilize the potential of the deep well. As a result thereof, it is possible to improve the noise resistance of the device.

An electronic device according to one aspect of the present technology, includes: a power supply source; and an electronic circuit.

The electronic circuit includes the MOS circuit portion, and the stabilizing element portion.

Advantageous Effects of Invention

As described above, according to the present technology, it is possible to improve noise resistance of a device in which an MOS circuit including a deep well is mounted. Note that, the effects described here are not necessarily limited, and may be any effect described in this disclosure.

MODE(S) FOR CARRYING OUT THE INVENTION

Hereinafter, embodiments according to the present technology will be described with reference to the drawings.

First Embodiment

[Configuration of MOS Circuit]

Figure 1:
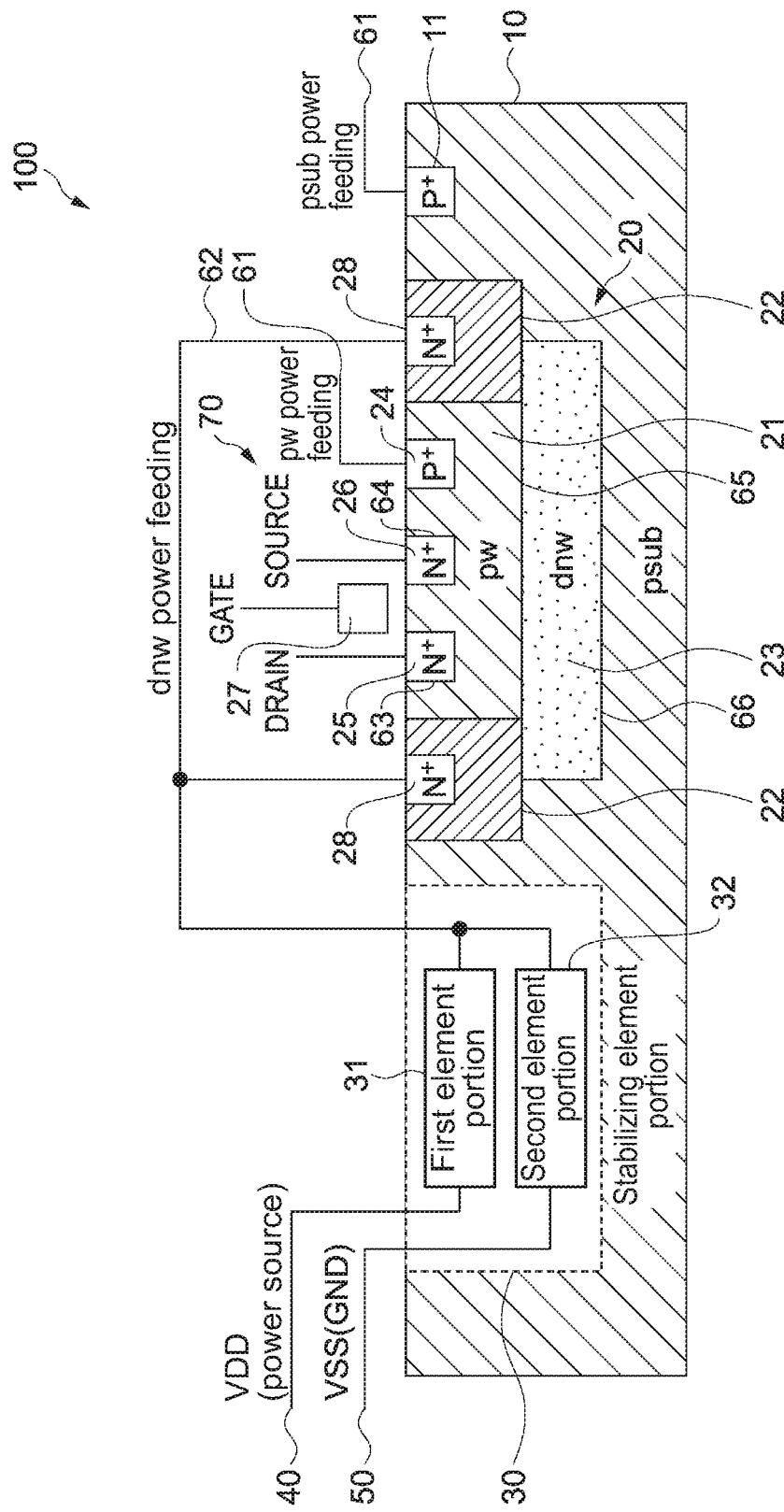
FIG. 1 is a sectional view illustrating an example of an element structure of an electronic circuit to which the present technology is applied.

FIG. 1 is a sectional view illustrating an example of an element structure of an electronic circuit to which the present technology is applied. An electronic circuit 100, for example, is mounted on an electronic device such as a mobile device such as a mobile terminal, a wearable device which is used by being mounted on the body, and an IoT device which is driven by a battery. The present technology can also be applied to an electronic device used for other application.

The electronic circuit 100 includes a P-type substrate 10, an MOS circuit portion 20, a deep well potential stabilizing element portion 30 (hereinafter, referred to as a stabilizing element portion 30), a power source 40, and a GND 50. In addition, the electronic circuit 100 includes a psub power feeding wiring 60, a pw power feeding wiring 61, and a dnw power feeding wiring 62.

The P-type substrate 10 is a semiconductor substrate on which the MOS circuit portion 20 and the stabilizing element portion 30 are formed. For example, a silicon substrate to which a P-type impurity such as boron is added, and the like are used as the P-type substrate 10. In FIG. 1, the P-type substrate 10 is represented as psub (the P-type substrate).

The P-type substrate 10 includes a substrate contact 11. For example, a region having a high impurity (boron) concentration (in FIG. 1, represented as P+) which is formed on an upper layer of the P-type substrate 10 is used as the substrate contact 11. The substrate contact 11 is a terminal for setting the potential of the P-type substrate 10, and for example, is connected to the GND 50 and the like. The potential and the like of the substrate contact 11 (the P-type substrate) are not limited, and for example, the substrate contact 11 may be suitably connected to an arbitrary potential which is capable of properly operating the MOS circuit portion and the like.

The MOS circuit portion 20 includes a P-type well 21, an N-type well 22, and a deep N-type well 23. In FIG. 1, the P-type well 21, the N-type well 22, and the deep N-type well 23 are represented as pw (the P-type well), nw (the N-type well), and dnw (the deep N-type well).

The P-type well 21 is a region of a P-type semiconductor which is formed on the upper layer of the P-type substrate 10. A pw contact 24, a drain 25, and a source 26 are formed in the P-type well 21. A gate 27 is formed on an upper portion of the P-type well 21 (in the vicinity of the front surface of the P-type substrate 10).

The pw contact 24 is a terminal for setting the potential of the P-type well 21. The pw contact 24 is connected to the pw power feeding wiring 61. A region having a high impurity concentration which is formed on the upper layer of the P-type well 21 is used as the pw contact 24.

The drain 25 and the source 26 are a region of an N-type semiconductor which is formed on the upper layer of the P-type well 21, and are formed by injecting an N-type impurity such as phosphorus or arsenic. The region in which the drain 25 and the source 26 are formed, for example, is a region having an impurity concentration higher than that of the N-type well or the deep N-type well described below (in FIG. 1, represented as N+).

A PN junction is formed between the drain 25 and the source 26 which are the region of the N-type semiconductor, and the P-type well 21. For this reason, a first PN junction diode 63 is formed between the drain 25 and the P-type well 21, and a second PN junction diode 64 is formed between the source 26 and the P-type well 21.

The drain 25 and the source 26 are provided to be adjacent to each other at a predetermined interval (a gate length L). In addition, wiring which is provided on the front surface of the P-type well 21 (the front surface of the P-type substrate 10) is connected to the drain 25 and the source 26.

The gate 27 is provided on the upper portion of the P-type well 21 through a gate insulating film (not illustrated) which is formed on the front surface of the P-type well 21. The gate 27 is formed to straddle the drain 25 and the source 26, and is connected to the wiring which is provided on the front surface of the P-type substrate 10. Thus, an NMOS transistor 70 including the drain 25, the source 26, and the gate 27 is formed in the P-type well 21.

The N-type well 22 is a region of the N-type semiconductor which is provided around the P-type well 21 to cover the lateral surfaces of the P-type well 21. In the sectional view illustrated in FIG. 1, the N-type well 22 which covers the right and left lateral surfaces of the P-type well 21 is schematically illustrated.

The N-type well 22 includes an nw contact 28. A region having a high impurity concentration which is formed on an upper layer of the N-type well 22 is used as the nw contact 28. The dnw power feeding wiring 62 is connected to the nw contact 28.

The deep N-type well 23 is a region of the N-type semiconductor which is provided on a side of the P-type well 21 opposite to the front surface. As illustrated in FIG. 1, the deep N-type well 23 is provided to cover the region in which the P-type well 21 is formed. In addition, the deep N-type well 23 is connected to the N-type well 22 which surrounds the lateral surfaces of the P-type well 21. Accordingly, the P-type well 21 is electrically separated from the P-type substrate 10 by the deep N-type well 23.

In the example illustrated in FIG. 1, the deep N-type well 23 is connected to the dnw power feeding wiring 62 through the N-type well 22 and the nw contact 28. Accordingly, the potential of the deep N-type well 23 is controlled through a voltage and the like which are input into the dnw power feeding wiring 62.

A third PN junction diode 65 is formed between the deep N-type well 23 and the P-type well 21. In addition, a fourth PN junction diode 66 is formed between the deep N-type well 23 and the P-type substrate 10. In this embodiment, the deep N-type well 23 corresponds to an N-type deep well in deep wells used in the MOS circuit and the like.

The stabilizing element portion 30 includes a first element portion 31 and a second element portion 32. The first element portion 31 is provided between the dnw power feeding wiring 62 and the power source (VDD) 40. The second element portion 32 is provided between the dnw power feeding wiring 62 and the GND (VSS) 50. In FIG. 1, the stabilizing element portion 30 which is provided on the P-type substrate 10 is schematically illustrated. In this embodiment, the power source 40 and the GND 50 correspond to a power supply source and a ground.

In the example illustrated in FIG. 1, one NMOS transistor 70 is formed on the deep N-type well 23. The present technology is not limited thereto, and for example, a plurality of NMOS transistors may be provided on the deep N-type well 23. In addition, a PMOS transistor may be suitably provided in addition to the NMOS transistor 70. That is, a CMOS circuit including the deep N-type well 23 may be configured. The present technology can be applied to an arbitrary MOS circuit including an analog circuit such as a voltage and current source, and a digital circuit such as a logic IC.

Figure 2:
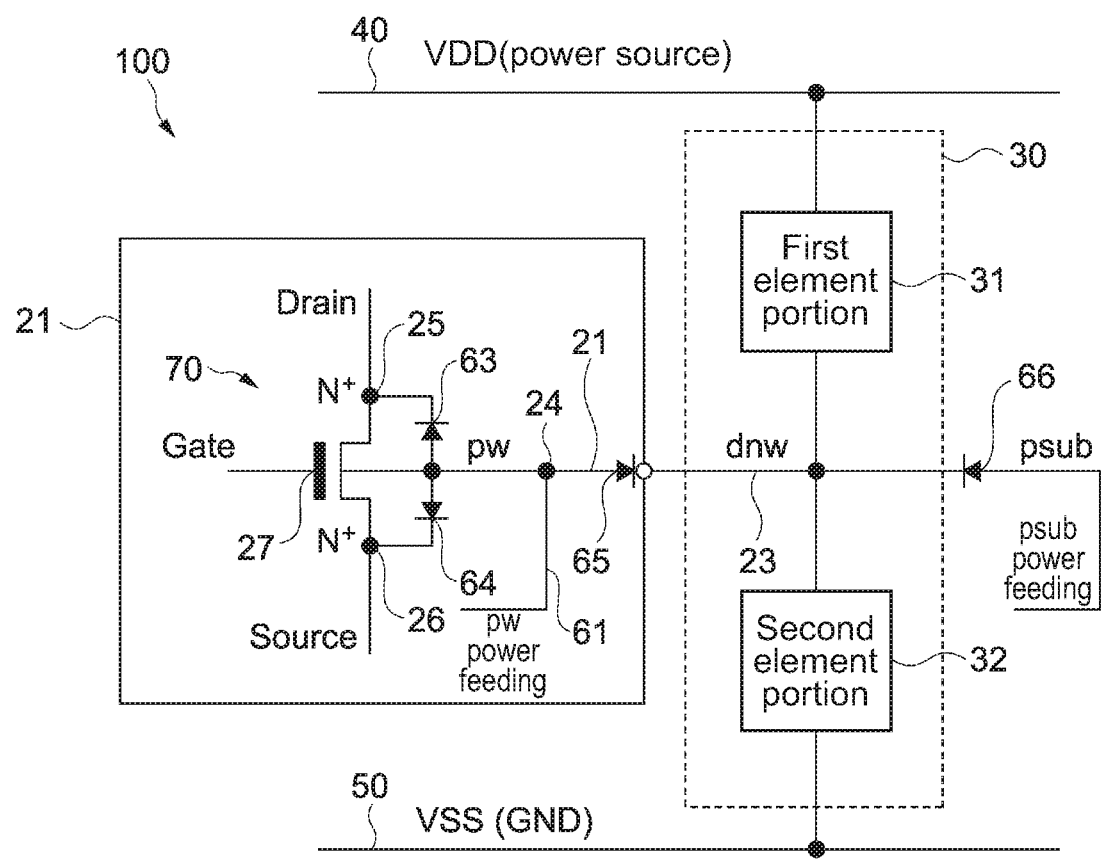
FIG. 2 is a schematic view illustrating a circuit configuration of the electronic circuit illustrated in FIG. 1.

FIG. 2 is a schematic view illustrating a circuit configuration of the electronic circuit 100 illustrated in FIG. 1. In FIG. 2, the region of the P-type well 21 in which the NMOS transistor 70 (the drain 25, the source 26, and the gate 27) is formed is schematically illustrated.

The P-type well 21 is connected to the drain 25 and the source 26 through the first PN junction diode 63 and the second PN junction diode 64, respectively. In addition, the P-type well 21 is connected to the pw power feeding wiring 61 through the pw contact 24.

The deep N-type well 23 is connected to the P-type well 21 through the third PN junction diode 65. As illustrated in FIG. 2, the third PN junction diode 65 is connected to the deep N-type well 23 from the P-type well 21 in a forward direction. In addition, the deep N-type well 23 is connected to the P-type substrate 10 through the fourth PN junction diode 66. The fourth PN junction diode 66 is connected to the deep N-type well 23 from the P-type substrate 10 in the forward direction.

The stabilizing element portion 30 stabilizes the potential of the deep N-type well. As illustrated in FIG. 2, the deep N-type well 23 is connected to the power source 40 through the first element portion 31 of the stabilizing element portion 30. In addition, the deep N-type well 23 is connected to the GND 50 through the second element portion 32 of the stabilizing element portion 30. The configuration of the first element portion 31 and the second element portion 32 are suitably designed, and thus, it is possible to stabilize the potential of the deep N-type well 23.

In this embodiment, the potential of the deep N-type well is retained at a value greater than or equal to the potential of the P-type well 21 by the stabilizing element portion 30. Accordingly, a reverse bias is applied to the third PN junction diode 65. In addition, as described above, the P-type substrate 10 is connected to a low potential of the GND and the like. Accordingly, the potential of the deep N-type well 23 is a value greater than that of the potential of the P-type substrate 10, and a reverse bias is also applied to the fourth PN junction diode 66. For this reason, it is possible to prevent the flow of an unnecessary current between the deep N-type well 23 and the other well.

Hereinafter, a specific electronic circuit using the MOS circuit described in FIG. 1 and FIG. 2 will be described.

Figure 3:
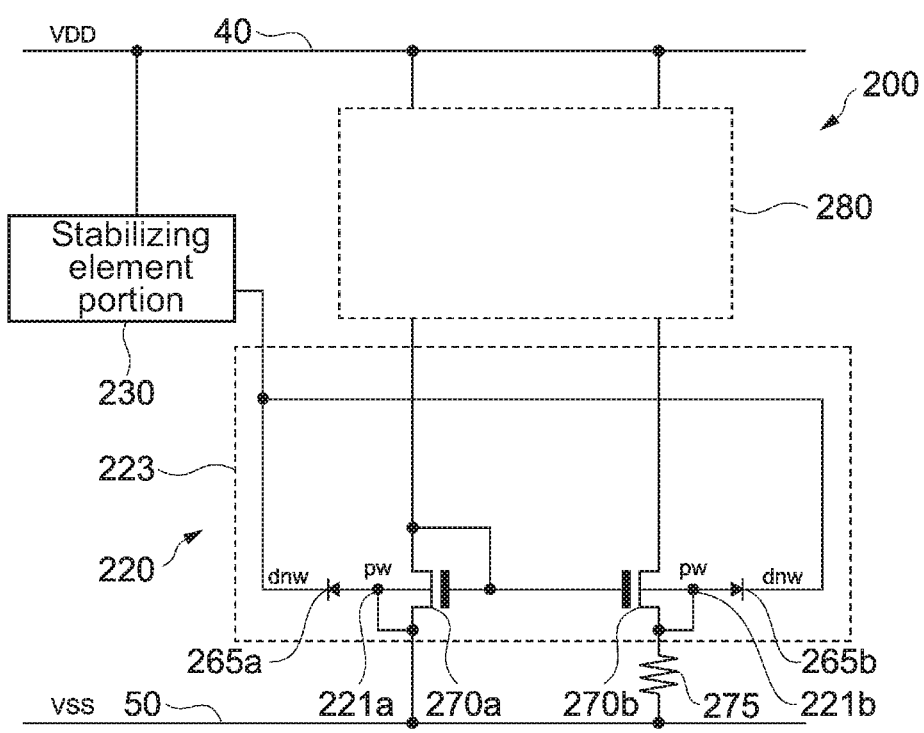
FIG. 3 is a circuit diagram illustrating a configuration example of a stabilizing element portion which adjusts a potential of a deep N-type well, and a constant current circuit.

FIG. 3 is a circuit diagram illustrating a configuration example of the stabilizing element portion which adjusts the potential of the deep N-type well, and a constant current circuit. An electronic circuit 200 functions as a constant current circuit, and includes an MOS circuit portion 220, a current circuit portion 280, and a stabilizing element portion 230.

The MOS circuit portion 220 includes a first NMOS transistor 270a, a second NMOS transistor 270b, and a resistance element 275. In FIG. 3, a region of a deep N-type well 223 which is formed under each of the NMOS transistors (under the P-type well) is schematically illustrated. In addition, in FIG. 3, a source of each of the NMOS transistors is illustrated on a lower side, and a drain is illustrated on an upper side.

The first NMOS transistor 270a is formed in a first P-type well 221a. In the first NMOS transistor 270a, a drain and a gate are connected to each other. In addition, a source of the first NMOS transistor 270a is connected to the first P-type well 221a and the GND 50. Accordingly, the first P-type well 221a is at a potential identical to that of the source of the first NMOS transistor 270a. In addition, the first P-type well 221a is connected to the deep N-type well 223 through a first junction diode 265a.

The second NMOS transistor 270b is formed in a second P-type well 221b. A gate of the second NMOS transistor 270b is connected to the gate of the first NMOS transistor 270a. A source of the second NMOS transistor 270b is connected to the GND 50 through the resistance element 275. In addition, the source of the second NMOS transistor 270b is connected to the second P-type well 221b. Accordingly, the second P-type well 221b is at a potential identical to that of the source of the second NMOS transistor 270b. In addition, the second P-type well 221b is connected to the deep N-type well 223 through a second junction diode 265b.

In this embodiment, the MOS circuit portion 220 (the first NMOS transistor 270a and the second NMOS transistor 270b) is operated in a subthreshold region. That is, the first NMOS transistor 270a and the second NMOS transistor 270b are designed to be operable at a gate voltage Vgs less than or equal to a threshold voltage Vth. Accordingly, the MOS circuit portion 220 functions as a low power consumption circuit which is driven by a minute current. For example, the MOS circuit portion 220 is operated by a current approximately greater than or equal to 1 nA and less than or equal to 100 nA, and the power consumption, for example, is several nW to several hundred nW.

A specific configuration and the like of the first NMOS transistor 270a and the second NMOS transistor 270b are not limited, and each parameter such as the gate length L or a gate width W is suitably set such that the first NMOS transistor 270a and the second NMOS transistor 270b are operable in the subthreshold region. In addition, each parameter and the like may be suitably set in accordance with an application and the like in which the first NMOS transistor 270a and the second NMOS transistor 270b are used.

The current circuit portion 280 is a circuit which supplies a predetermined current to the MOS circuit portion 220. As illustrated in FIG. 3, the current circuit portion 280 is connected to the drain of the first NMOS transistor 270a and the drain of the second NMOS transistor 270b, respectively. Then, currents identical to each other are respectively supplied to the drains of the NMOS transistors. A specific configuration and the like of the current circuit portion 280 are not limited, and a circuit which is capable of supplying the same current to the first NMOS transistor 270a and the second NMOS transistor 270b may be suitably configured (for example, refer to a current circuit portion 1280 of FIG. 9).

A drain current $I_D$ flowing the MOS transistor in the subthreshold (weak inversion) region, is given by the following expression by using the gate voltage Vgs, the threshold voltage Vth, and a source drain voltage Vds.

$$I_D = \beta(\eta - 1)V_T^2 \exp\left(\frac{V_{gs} - V_{th}}{\eta V_T}\right)\left[1 - \exp\left(-\frac{V_{ds}}{V_T}\right)\right] \quad \text{[Math. 1]}$$

$$V_T = \frac{kT}{q}, \beta = \frac{W}{L}\mu C_{ox}$$

Here, $\eta$ is a slope factor, Vt is a temperature voltage represented by a Boltzmann constant k, a temperature T, and a charge q of a carrier. In addition, $\beta$ is a size ratio of the MOS transistor represented by the gate width W, the gate length L, a carrier mobility $\mu$ and a gate capacitance $C_{ox}$ of the MOS transistor.

In a case in which the source drain voltage Vds is sufficiently greater than the temperature voltage Vt, (Math. 1) is approximated as follows.

$$I_D \approx \beta(\eta - 1)V_T^2 \exp\left(\frac{V_{gs} - V_{th}}{\eta V_T}\right) \quad \text{[Math. 2]}$$

From (Math. 2), it is known that the drain current $I_D$ greatly exponentially increases or decreases with respect to the gate voltage Vgs. In other words, the gate voltage Vgs is not greatly changed with respect to a change in the drain current $I_D$. The gate voltage Vgs is calculated from (Math. 2) as follows.

$$V_{gs} = \eta V_T \ln\left(\frac{I_D}{\beta(1 - \eta)V_T^2}\right) + V_{th} \quad \text{[Math. 3]}$$

In the MOS circuit portion 220 illustrated in FIG. 3, an aspect ratio ($\beta 1:\beta 2$) of the first NMOS transistor 270a and the second NMOS transistor 270b is set to 1:N, and currents having the same size (the drain current $I_D$) are respectively supplied to the NMOS transistors. In this case, a gate voltage Vgs1 and a gate voltage Vgs2 of the first NMOS transistor 270a and the second NMOS transistor 270b have values different from each other in accordance with a difference in the size. Accordingly, $\Delta$Vgs which is a difference in each of the gate voltages is applied to the resistance element 275. $\Delta$Vgs is calculated as follows.

$$\Delta V_{gs} = \quad \text{[Math. 4]}$$
$$V_{gs1} - V_{gs2} = \eta V_T \ln\left(\frac{I_D}{\beta_1(1 - \eta)V_T^2}\right) - \eta V_T \ln\left(\frac{I_D}{\beta_2(1 - \eta)V_T^2}\right) =$$

-continued $$\eta V_T \ln\left(\frac{\beta_2}{\beta_1}\right) = \eta V_T \ln(N)$$

Accordingly, in a case in which a resistance value of the resistance element 275 is set to R, the drain current $I_D$ flowing the first NMOS transistor 270a and the second NMOS transistor 270b is calculated by a potential difference $\Delta$Vgs as follows.

$$I_D = \frac{\eta V_T \ln(N)}{R} \quad \text{[Math. 5]}$$

As represented in (Math. 5), the drain current $I_D$ is set by a resistance value R and a size ratio N of each of the NMOS transistors, and is a current which does not depend on a power source voltage and the like. Thus, a constant current source in which a variation is small with respect to a variation in the power source voltage and the like, and a constant current is generated is configured by using the MOS circuit portion 220 and the current circuit portion 280 illustrated in FIG. 3. Note that, the configuration of the MOS circuit portion 220 is not limited to the example illustrated in FIG. 3, and may be suitably changed in accordance with the application of the circuit and the like.

Figure 4A:
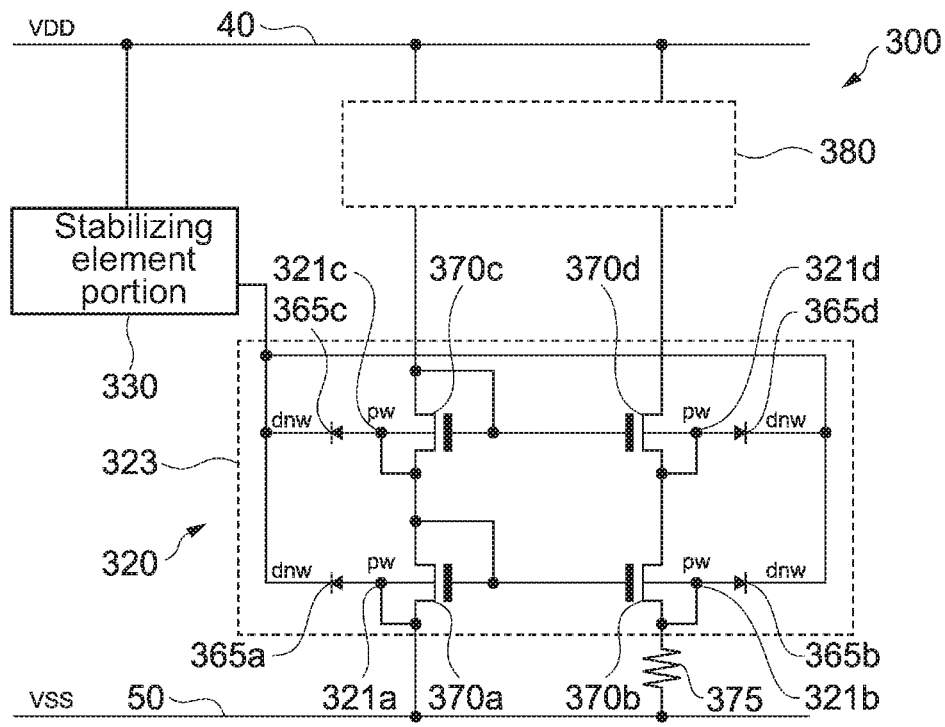
FIGS. 4A and 4B are circuit diagrams illustrating another configuration example of the electronic circuit illustrated in FIG. 3.
Figure 4B:
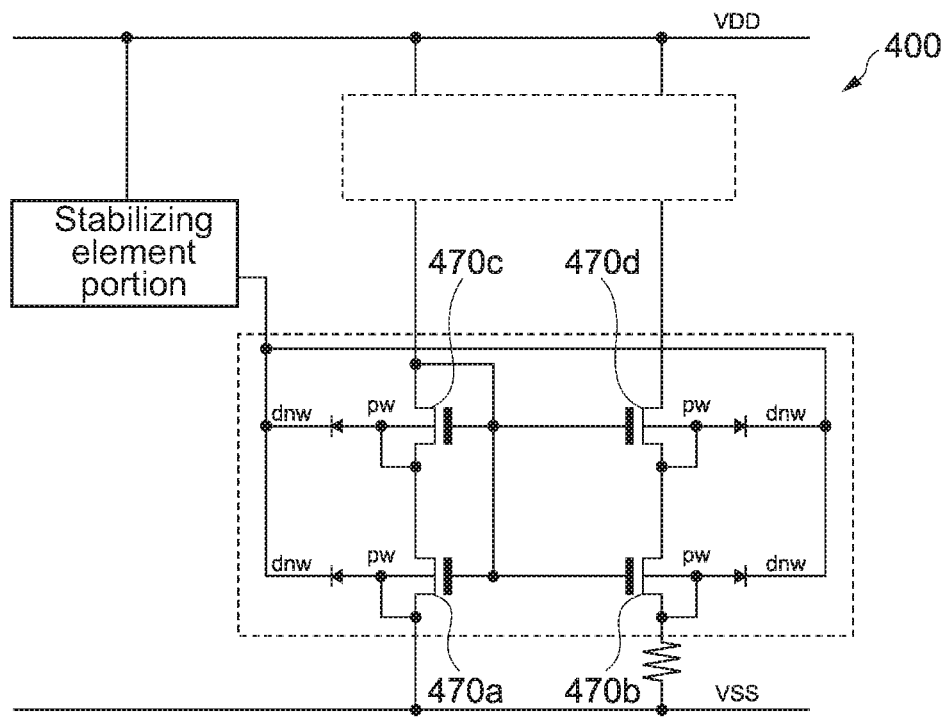

FIGS. 4A and 4B are circuit diagrams illustrating another configuration example of the electronic circuit 200 illustrated in FIG. 3. FIG. 4A is a circuit diagram of an electronic circuit 300 including cascode-connected (multistage-stacked) NMOS transistors. FIG. 4B is a circuit diagram of an electronic circuit 400 including composite cascode-connected NMOS transistors.

The electronic circuit 300 illustrated in FIG. 4A includes an MOS circuit portion 320, a current circuit portion 380, and a stabilizing element portion 330. The current circuit portion 380 and the stabilizing element portion 330 may have a configuration which is identical to that of the electronic circuit 200 illustrated in FIG. 3.

The MOS circuit portion 320 includes a first NMOS transistor 370a to a fourth NMOS transistor 370b, and a resistance element 375. The first NMOS transistor 370a, the second NMOS transistor 370b, and the resistance element 375 are connected as with the first NMOS transistor 270a and the second NMOS transistor 270b, and the resistance element 375 illustrated in FIG. 3.

The third NMOS transistor 370c is formed in a third P-type well 321c. In the third NMOS transistor 370c, a drain and a gate are connected to each other. In addition, a source of the third NMOS transistor 370c is connected to the third P-type well 321c and a drain of the first NMOS transistor 370a. In addition, the third P-type well 321c is connected to a deep N-type well 323 through a third junction diode 365c.

The fourth NMOS transistor 370d is formed in a fourth P-type well 321d. A gate of the fourth NMOS transistor 370d is connected to the gate of the third NMOS transistor 370c. In addition, a source of the fourth NMOS transistor 370d is connected to the fourth P-type well 321d and a drain of the second NMOS transistor 370b. In addition, the fourth P-type well 321d is connected to the deep N-type well 323 through a fourth junction diode 365d.

The current circuit portion 380 is connected to the drain of the third NMOS transistor 370c and the drain of the fourth NMOS transistor 370d, respectively, and supplies currents identical to each other. The stabilizing element portion 330 is connected to the deep N-type well 323, and stabilizes the potential of the deep N-type well 323.

Thus, in FIG. 4A, the third NMOS transistor 370c and the fourth NMOS transistor 370d are provided on the upstream (on the current circuit portion 380 side) of the first NMOS transistor 370a and the second NMOS transistor 370b, and cascode-connected NMOS transistor circuits are configured. Note that, the configuration and the like of the first NMOS transistor 370a to the fourth NMOS transistor 370b are not limited. For example, the parameter such as the gate width W of each of the NMOS transistors may be suitably set in accordance with an application and the like of the MOS circuit portion 320.

For example, in a case in which the voltage of the power source 40 is high, the source drain voltage Vds to be applied to the NMOS transistor increases, and there is a possibility that a current increases due to impact ionization. The NMOS transistors are cascode-connected, and thus, it is possible to disperse a voltage by a plurality of NMOS transistors, and it is possible to suppress an increase in the current, and the like.

The electronic circuit 400 illustrated in FIG. 4B is a configuration example in a case in which a first NMOS transistor 470a to a fourth NMOS transistor 470b are composite cascode-connected. In the composite cascode connection, for example, there is a case in which an aspect ratio of the second stage (the third NMOS transistor 470c and the fourth NMOS transistor 470d) is set to be greater than an aspect ratio of the first stage (the first NMOS transistor 470a and the second NMOS transistor 470b). The present technology is not limited thereto, and the size and the like of each of the NMOS transistors may be suitably set.

Figure 5A:
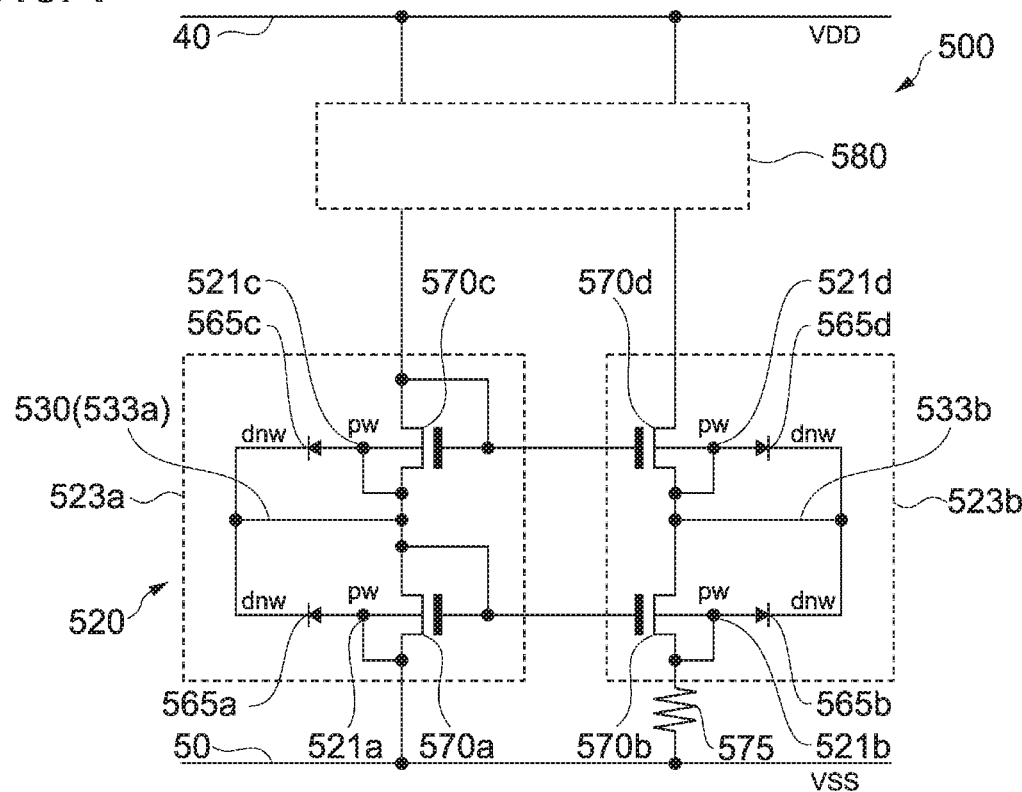
FIGS. 5A and 5B are circuit diagrams illustrating a configuration example of an electronic circuit according to a first embodiment.
Figure 5B:
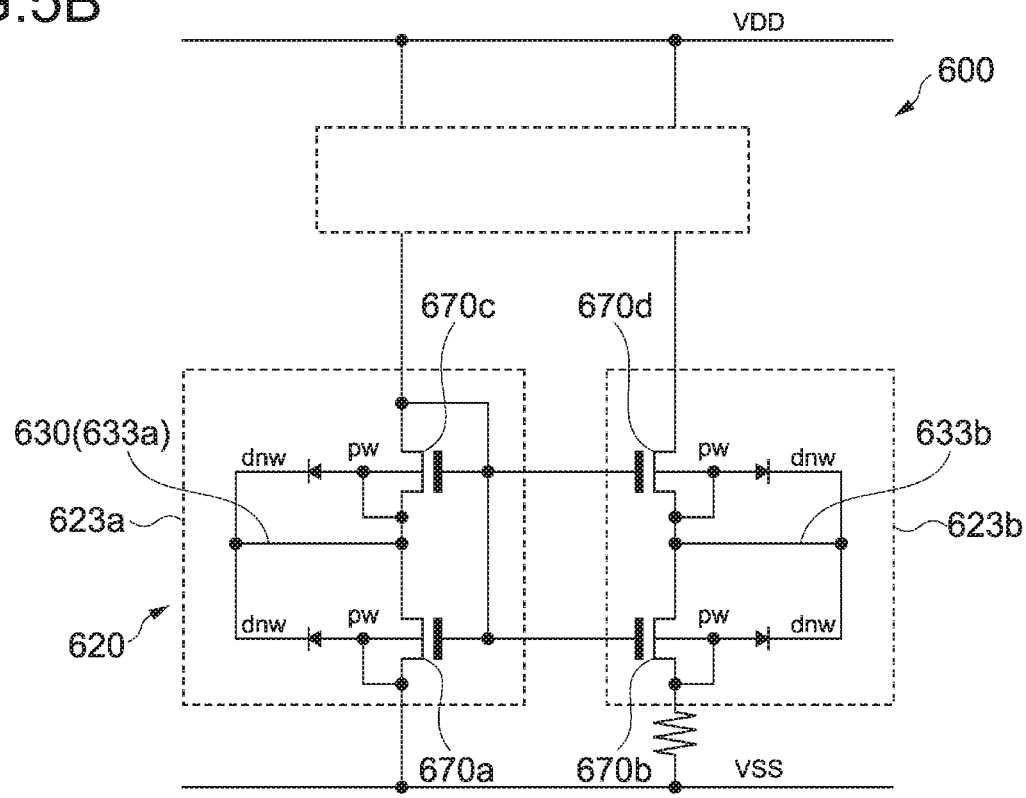

FIGS. 5A and 5B are circuit diagrams illustrating a configuration example of an electronic circuit according to a first embodiment. FIG. 5A is a circuit diagram of an electronic circuit 500 including cascode-connected NMOS transistors. FIG. 5B is a circuit diagram of an electronic circuit 600 including composite cascode-connected NMOS transistors.

The electronic circuit 500 illustrated in FIG. 5A includes an MOS circuit portion 520, a current circuit portion 580, and a stabilizing element portion 530. In FIG. 5A, a first deep N-type well 523a and a second deep N-type well 523b which are separated from each other are formed.

The first deep N-type well 523a is provided to cover a first NMOS transistor 570a and a third NMOS transistor 570c, that is, a region of a first P-type well 521a and a third P-type well 521c. Accordingly, the first P-type well 521a and the third P-type well 521c are connected to the first deep N-type well 523a through a first PN junction diode 565a and a third PN junction diode 565c.

The second deep N-type well 523b is provided to cover a second NMOS transistor 570b and a fourth NMOS transistor 570d, that is, a region of a second P-type well 521b and a fourth P-type well 521d. Accordingly, the second P-type well 521b and the fourth P-type well 521d are connected to the second deep N-type well 523b through a second PN junction diode 565b and a fourth PN junction diode 565d.

Note that, each number of deep N-type wells, the region to be provided, and the like are not limited. For example, as with FIG. 4A, one deep N-type well which covers the first NMOS transistor 570a to the fourth NMOS transistor 570d may be provided. In addition, deep N-type wells respectively corresponding to NMOS transistors may be individually provided.

The stabilizing element portion 530 includes a first wiring portion 533a and a second wiring portion 533b. As illustrated in FIG. 5A, the first wiring portion 533a is wiring which connects a drain of the first NMOS transistor 570a and the first deep N-type well 523a to each other. In addition, the first wiring portion 533a is wiring which connects a source of the third NMOS transistor 570c and the first deep N-type well 523a to each other.

The second wiring portion 533b is wiring which connects a drain of the second NMOS transistor 570b and the second deep N-type well 523b to each other. In addition, the second wiring portion 533b is wiring which connects a source of the fourth NMOS transistor 570d and the second deep N-type well 523b to each other.

Thus, in FIG. 5A, the potential of the first deep well 523a and the second deep well 523b is set by the first wiring portion 533a and the second wiring portion 533b which function as the stabilizing element portion 530. Hereinafter, the potentials of each of the deep N-type wells and each of the P-type wells provided thereon are compared with each other.

In the first NMOS transistor 570a, the potentials of the gate, the source, and the drain with respect to the GND 50 are respectively represented as a gate potential Vg1, a source potential Vs1, and a drain potential Vd1. Note that, the same applies to the second NMOS transistor 570b to fourth NMOS transistor 570d.

As illustrated in FIG. 5A, the potential of the first P-type well 521a is identical to the source potential Vs1 of the first NMOS transistor 570a, and is a potential identical to that of the GND 50. On the other hand, the potential of the first deep N-type well 523a is a potential identical to the drain potential Vd1 (the gate potential Vg1) of the first NMOS transistor 570a. Accordingly, the potential of the first deep N-type well 523a is retained at a value greater than that of the potential of the first P-type well 521a.

The potential of the third P-type well 521c is identical to a source potential Vs3 of the third NMOS transistor 570c. In addition, the potential of the first deep N-type well 523a is also identical to the source potential Vs3 of the third NMOS transistor 570c. That is, the potential of the first deep N-type well 523a is retained at a value identical to that of the potential of the third P-type well 521c.

The potential of the second P-type well 521b is identical to a source potential Vs2 of the second NMOS transistor 570b. On the other hand, the potential of the second deep N-type well 523b is identical to a drain potential Vd2 of the second NMOS transistor 570b. Accordingly, the potential of the second deep N-type well 523b is retained at a value greater than the potential of the second P-type well 521b.

The potential of the fourth P-type well 521d is identical to a source potential Vs4 of the fourth NMOS transistor 570d. In addition, the potential of the second deep N-type well 523b is also identical to the source potential Vs4 of the fourth NMOS transistor 570d. That is, the potential of the second deep N-type well 523b is retained at a value identical to that of the potential of the fourth P-type well 521d.

Accordingly, the potential of each of the deep N-type wells is retained at a value greater than or equal to the potential of the P-type well provided in the region of each of the deep N-type wells by the stabilizing element portion 530. Accordingly, a forward bias (voltage) is prevented from being applied to the first PN junction diode 565a to the fourth PN junction diode 565d. Accordingly, it is possible to properly operate each of the NMOS transistors.

Thus, a potential on a drain side of the first stage (the first NMOS transistor 570a and the second NMOS transistor 570b) is connected to each of the deep N-type wells by the stabilizing element portion 530. The drain side of the first stage functions as a stable voltage source having a small right and left potential difference, compared to a source side of the first stage.

In addition, a potential on a source side of the second stage (the third NMOS transistor 570c and the fourth NMOS transistor 570d) is connected to each of the deep N-type wells. The source side of the second stage functions as a voltage source which is stable with respect to a voltage variation of the power source 40, compared to a drain side of the second stage (a current circuit side). Accordingly, the stabilizing element portion 530 is capable of sufficiently stabilizing the potential of each of the deep N-type wells.

In such a configuration, the potential of the first deep N-type well 523a and the second deep N-type well 523b is set by using the potential of each of the NMOS transistors. That is, in such a configuration, the NMOS transistor itself functions as a part of the stabilizing element portion 530. For example, the third NMOS transistor 570c also functions as the first element portion 31 which is arranged between the power source 40 and the first deep N-type well 523a, and the first NMOS transistor 570a functions as the second element portion 32 which is arranged between the GND 50 and the first deep N-type well 523a. Similarly, the second NMOS transistor 570b and the fourth NMOS transistor 570d function as the first element portion and the second element portion when seen from the second deep N-type well 523b.

Note that, the first wiring portion 533a and the second wiring portion 533b may be connected to different potentials. For example, in a case in which a gate potential of the second stage (a gate potential Vg3 of the third NMOS transistor) is stable with respect to a voltage variation of the power source 40 and the like, a circuit may be configured in which each of the wiring portions is connected to the gate potential of the second stage.

In addition, an NMOS transistor of the third stage and the like may be connected in addition to the first stage and the second stage. In this case, the first wiring portion 533a and the second wiring portion 533b (the stabilizing element portion 530) may be suitably provided such that the potential of each of the deep N-type wells is a potential greater than or equal to the potential of the P-type well in which each of the NMOS transistors is formed.

Similarly, in the electronic circuit 600 of the composite cascode connection illustrated in FIG. 5B, a first wiring portion 633a and a second wiring portion 633b are provided. A first deep N-type well 623a is connected to a drain of a first NMOS transistor 670a (a source of a third NMOS transistor 670c) by the first wiring portion 633b. A second deep N-type well 623b is connected to the drain of the second NMOS transistor 570b (the source of the fourth NMOS transistor 570d) by the second wiring portion 633b. Accordingly, it is possible to sufficiently stabilize the potential of the first deep N-type well 623a and the second deep N-type well 623b, and it is possible to stably operate the circuit of the NMOS transistor (an MOS circuit portion 620).

Figure 6:
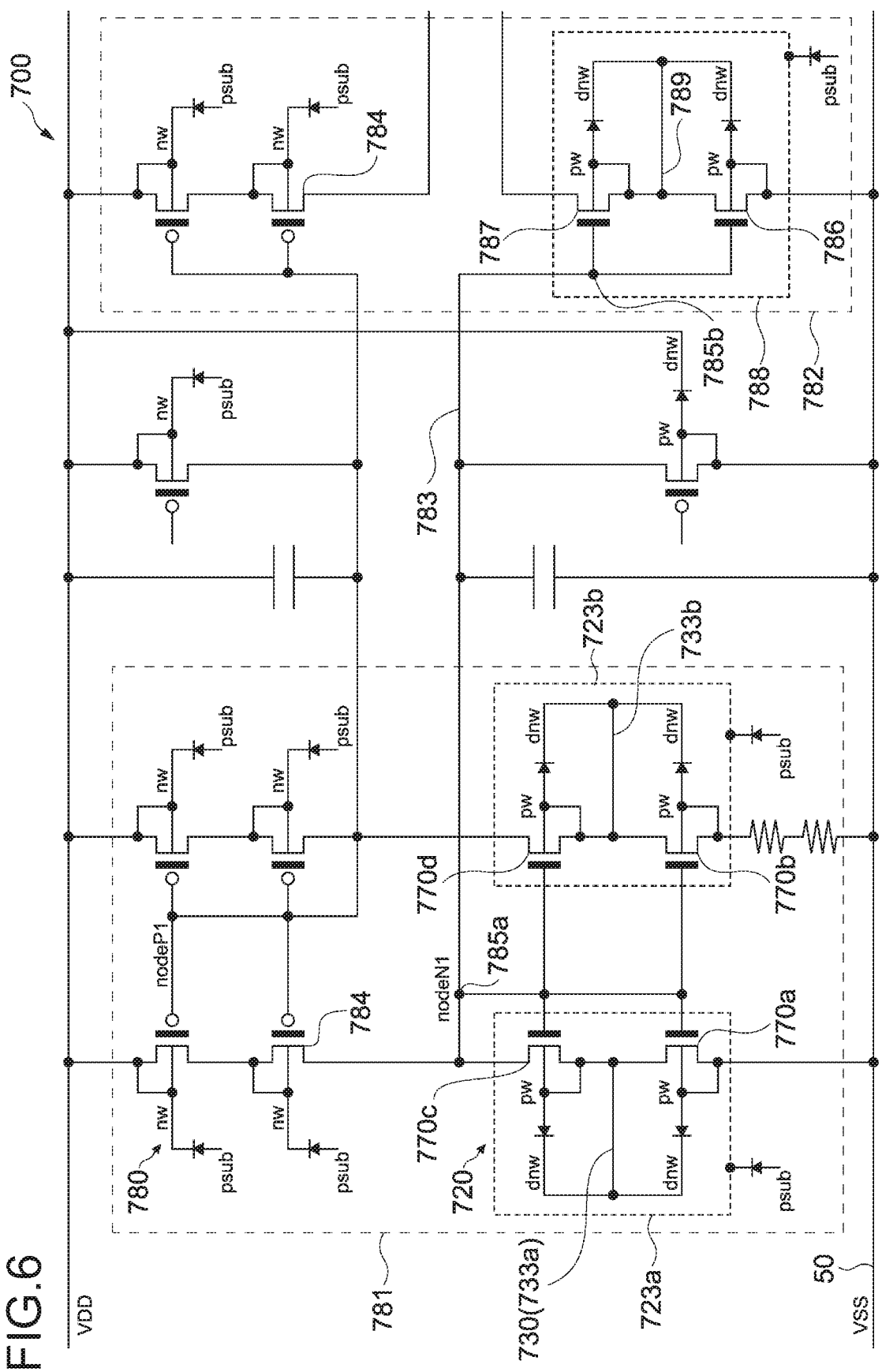
FIG. 6 is a circuit diagram more specifically illustrating the electronic circuit illustrated in FIG. 5B.

FIG. 6 is a circuit diagram more specifically illustrating the electronic circuit illustrated in FIG. 5B. An electronic circuit 700 illustrated in FIG. 6 includes a constant current circuit 781, a current copy circuit 782, and a copy wiring 783. In FIG. 6, a current mirror circuit which copies a current generated by the constant current circuit 781 to the current copy circuit 782 through the copy wiring 783 is configured.

The constant current circuit 781 has a configuration which is approximately identical to that of the electronic circuit 600 illustrated in FIG. 5B, and includes an MOS circuit portion 720, a current circuit portion 780, and a stabilizing element portion 730. The current circuit portion 780 is configured of four PMOS transistors 784. The MOS circuit portion 720 includes a first NMOS transistor 770a to a fourth NMOS transistor 770d which are composite cascode-connected. A first node 785a is provided on wiring which connects a gate and a drain of the third NMOS transistor 770c to each other.

The stabilizing element portion 730 includes a first wiring portion 733a and a second wiring portion 733b. The first wiring portion 733a connects a grain of the first NMOS transistor 770a (a source of the third NMOS transistor 770c) and a first deep N-type well 723a to each other. The second wiring portion 733b connects a drain of the second NMOS transistor 770b (a source of the fourth NMOS transistor 770d) and a second deep N-type well 723b to each other. Accordingly, the potential of the first deep N-type well 723a and the second deep N-type well 723b is stabilized.

The current copy circuit 782 includes a fifth NMOS transistor 786 and a sixth NMOS transistor 787. Each of the NMOS transistors is provided in a region in which a deep N-type well 788 is formed. A source of the fifth NMOS transistor 786 is connected to the GND 50, and a drain is connected to a source of the sixth NMOS transistor 787. A drain of the sixth NMOS transistor 787 is suitably connected to a load circuit and the like (not illustrated). Gates of each of the NMOS transistors are connected to each other, and a second node 785b is provided on wiring which connects the gates to each other.

In addition, in the current copy circuit 782, the deep N-type well 788 and a drain of the fifth NMOS transistor 786 (the source of the sixth NMOS transistor 787) are connected to each other through a wiring portion 789 (the stabilizing element portion 730). Accordingly, the potential of the deep N-type well 788 is stabilized by the fifth NMOS transistor 786 and the sixth NMOS transistor 787. Thus, the present technology can also be applied to the current copy circuit 782.

The copy wiring 783 connects the first node 785a and the second node 785b to each other. Accordingly, a current flowing the constant current circuit 781 is copied to the current copy circuit 782. The copied current, for example, is supplied to the load circuit and the like which are connected to the sixth NMOS transistor 787. Note that, in the electronic circuit 700, the current of the current circuit portion 780 is copied by two PMOS transistors 784 which are provided in the current copy circuit 782.

Thus, in the electronic circuit 700 illustrated in FIG. 6, as with the constant current circuit 781 which is a copy source of the current, the potential of the deep N-type well 788 of the current copy circuit 782 which is a copy destination of the current is stabilized. Accordingly, it is possible to copy the current with a high accuracy by using the current mirror circuit and the like. Note that, other configurations may be used as the configuration of the wiring portion 789 (the stabilizing element portion) which is provided in the current copy circuit 782.

As described above, in the electronic circuit according to this embodiment, the potential of the deep N-type well is fixed to a desired potential by the stabilizing element portion including the first element portion 31 which is arranged between the power source 40 and the deep N-type well of the MOS circuit portion. Accordingly, for example, it is possible to prevent the flow of an unnecessary current by applying a forward potential to a parasite diode between the deep N-type well and the P-type well. The potential of the deep well is not directly connected to the power source 40 or the GND 50, and thus, it is possible to decrease a fluctuation in the potential of the deep well even in a case in which there is a power source noise or a GND noise, and it is possible to improve noise resistance.

In the related art, a well separation method of setting the potential of the well in which an element such as the MOS transistor is formed to a potential different from the potential of the substrate by using the deep well is known. In order to set the potential of the deep well, there is a method of directly connecting the deep well to the power source voltage of the electronic circuit. In such a configuration, there is a possibility that the potential of the deep well greatly varies in accordance with a variation in the power source voltage.

For example, there is a case in which a V battery (VBAT) system is used as the power source of the electronic circuit. The VBAT system is a system in which the power source is temporarily switched to a super capacitor and the like when the voltage of the battery decreases, and a circuit operation is maintained. When the power source is switched by the VBAT system, there is a possibility that a variation in the power source voltage of greater than or equal to 1 V occurs, and there is a possibility that the potential of the deep well which is connected to the power source is also greatly changed.

In a case in which the potential of the deep well is changed, there is a possibility that the operation and the like of the electronic circuit are unstable. For example, a diode junction portion (an electric capacitance C) is formed between the well in which the element is formed and the deep well. In a case in which a voltage V which is applied to the diode junction portion (a potential difference between the well and the deep well) is changed, an AC current i described below flows the diode junction portion.

$$i = C \frac{dV}{dt}$$ [Math. 6]

In a case in which an electric capacitance of the diode junction portion is set to 200 fF, and the slope of a voltage change is set to 1 V/100 μs, an AC current of 2 nA flows the diode junction portion in accordance with a change in the voltage V. Accordingly, in a case in which the potential of the deep well is greatly changed, an unnecessary current of several nanoamperes flows between the deep well and the well.

For example, the MOS transistor and the like which are operated in the subthreshold region, are driven by a minute current of nanoampere order. In such a low power consumption electronic circuit, there is a concern that a problem such as an operation failure or the malfunction of the electronic circuit occurs due to an unnecessary current according to a potential change of the deep well.

In the electronic circuit according to this embodiment, the power source 40 and the deep N-type well are connected to each other through the stabilizing element portion (the first element portion 31). Accordingly, the potential of the deep N-type well is sufficiently stabilized not to be greatly changed with respect to a variation in the power source voltage by the stabilizing element portion. Accordingly, it is possible to improve power source voltage variation resistance (noise resistance) of the electronic circuit, and it is possible to improve an operation accuracy of the device.

In addition, in the electronic circuit according to this embodiment, the GND 50 and the deep N-type well are connected to each other through the stabilizing element portion (the second element portion 32). Accordingly, for example, a stable potential based on the GND 50 is supplied to the deep N-type well by the stabilizing element portion. Thus, the stabilizing element portion is capable of sufficiently stabilizing the potential of the deep N-type well by using the first element portion 31 and the second element portion 32.

For example, in a low power large-scale integration (LSI) circuit, a low power microcomputer, and the like, the VBAT system having a wide power source voltage range (1.65 V-5.5 V) corresponding to a low voltage (a specification of 1.8 V and the like), and the like are used in order to increase a battery driving time. In such a case, the potential of the deep N-type well is retained through the stabilizing element portion, and thus, for example, it is possible to correspond to a power source voltage change from 1.65 V to 5.5 V. As a result thereof, it is possible to improve noise resistance of a low power consumption device such as the low power LSI circuit.

In addition, a real-time clock (RTC) circuit and the like having a clock and calendar function and the like are a circuit which is connected to the power source 40 even in a standby state. In such a circuit, the power source voltage variation resistance is improved, and thus, it is possible to sufficiently prevent the occurrence of malfunction according to the switch of the power source. As a result thereof, it is possible to accurately operate the RTC circuit.

In addition, in the NMOS transistor which is operated in the subthreshold region and configures an analog circuit such as a current circuit or a voltage circuit, there is a case in which an element size (the gate width and the like) increases. For example, in the composite cascode-connected NMOS transistors as illustrated in FIG. 5B, the element size is set to be large in order to increase the aspect ratio of the second stage (the third NMOS transistor 670c and the fourth NMOS transistor 670d). In such an element, a junction area between the P-type well and the deep N-type well increases, and the electric capacitance C of the junction portion increases.

The potential of the deep N-type well is stably retained with respect to the NMOS transistor having a large electric capacitance C, and thus, it is possible to sufficiently prevent the flow of an unnecessary current (an AC noise and the like) between the deep N-type well and the P-type well. As a result thereof, it is possible to considerably improve noise resistance of the analog circuit and the like which are operated in the subthreshold region.

In addition, in this embodiment, the deep N-type well is connected to any one of the gate, the source, and the drain of the NMOS transistor. Accordingly, for example, a gate potential, a source potential, a drain potential, and the like having a small variation with respect to the power source voltage can be suitably used as the potential of the deep N-type well. Thus, it is possible to easily improve the noise resistance of the device by using each potential of the NMOS transistor.

Second Embodiment

An electronic circuit of a second embodiment according to the present technology will be described. In the following description, the description of configurations and functions identical to those of the electronic circuits 100 to 700 described in the embodiment described above will be omitted or simplified.

Figure 7A:
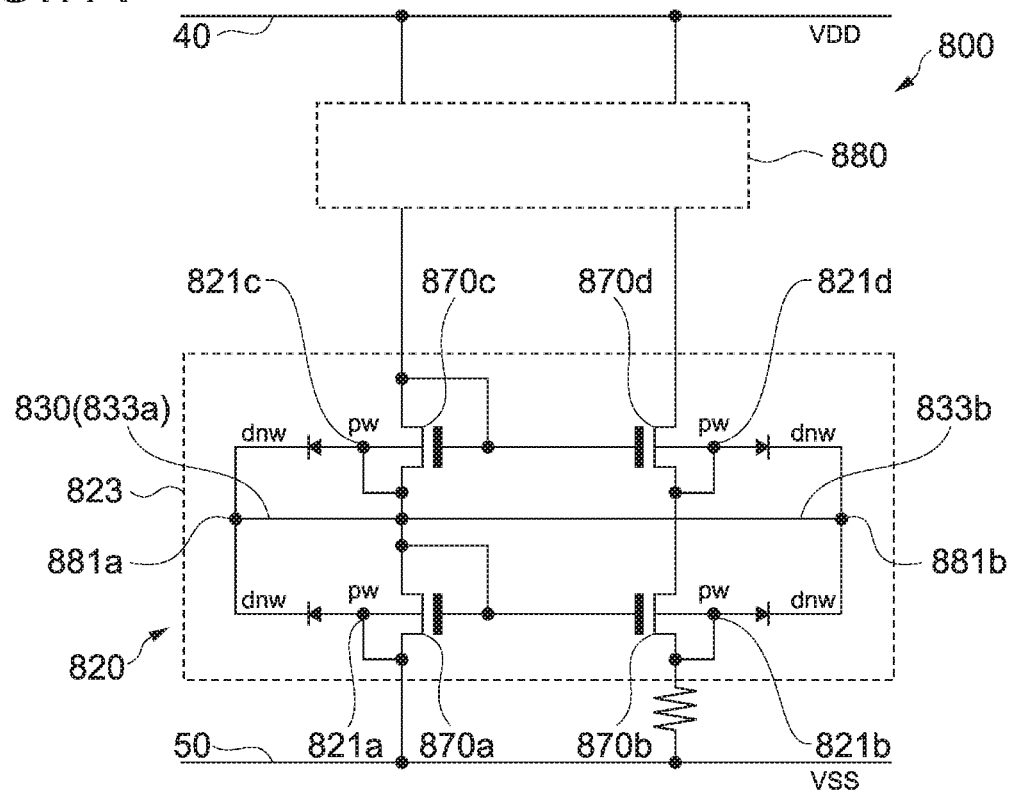
FIGS. 7A and 7B are circuit diagrams illustrating a configuration example of an electronic circuit according to a second embodiment.
Figure 7B:
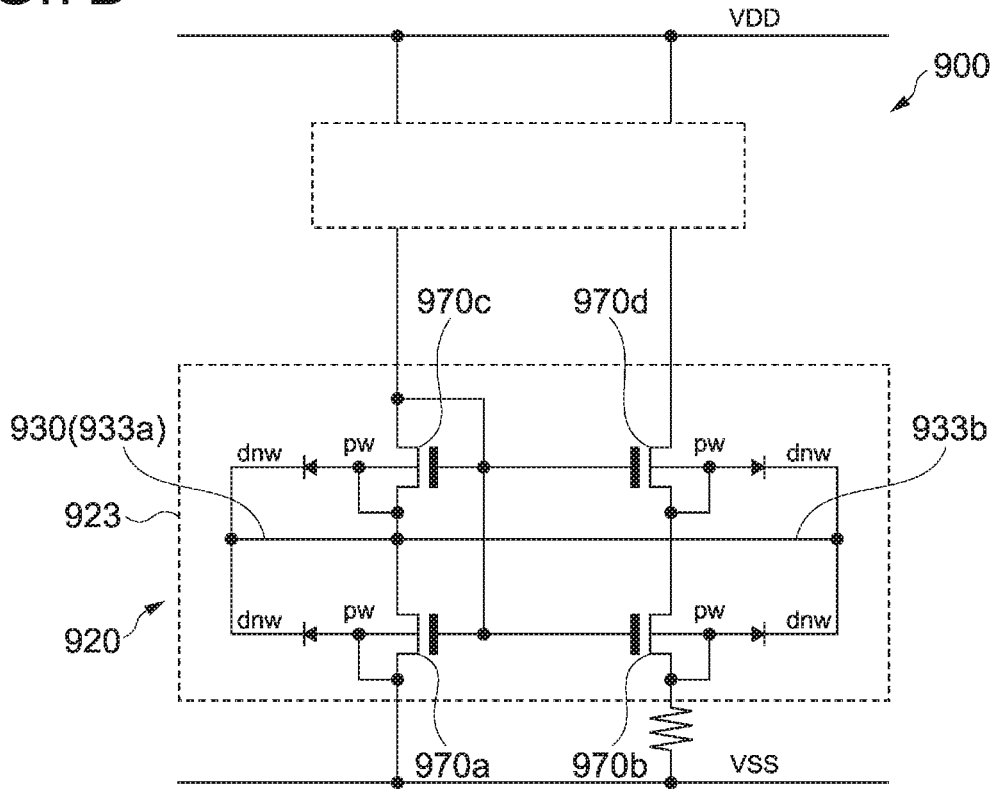

FIGS. 7A and 7B are circuit diagrams illustrating a configuration example of the electronic circuit according to the second embodiment. FIG. 7A is a circuit diagram of an electronic circuit 800 including cascode-connected NMOS transistors. FIG. 7B is a circuit diagram of an electronic circuit 900 including composite cascode-connected NMOS transistors.

The electronic circuit 800 illustrated in FIG. 7A includes an MOS circuit portion 820, a current circuit portion 880, and a stabilizing element portion 830. The MOS circuit portion 820 has a configuration which is approximately identical to that of the MOS circuit portion 320 illustrated in FIG. 4A, and includes a first NMOS transistor 870a to a fourth NMOS transistor 870d which are cascode-connected. In addition, each of the transistors is provided on a deep N-type well 823.

The first NMOS transistor 870a to the fourth NMOS transistor 870d are formed in a first P-type well 821a to a fourth P-type well 821d which are separated from each other, respectively. In this embodiment, the first P-type well 821a to the fourth P-type well 821d correspond to a plurality of P-type wells which is electrically separated from the P-type substrate by the deep N-type well. In addition, the first NMOS transistor 870a to the fourth NMOS transistor 870d correspond to a plurality of NMOS transistors which is formed in the plurality of P-type wells, respectively.

In the circuit diagram illustrated in FIG. 7A, the potential of the deep N-type well 823 which is positioned under the first NMOS transistor 870a (the third NMOS transistor 870c) corresponds to the potential of a first node 881a. In addition, the potential of the deep N-type well 823 which is positioned under the second NMOS transistor 870b (the fourth NMOS transistor 870d) corresponds to the potential of a second node 881b. The first node 881a and the second node 881b are provided on one deep N-type well 823, and are at potentials which are approximately equal to each other.

The stabilizing element portion 830 includes a first wiring portion 833a and a second wiring portion 833b. The first wiring portion 833a is provided between a drain of the first NMOS transistor 870a and the first node 881a. In addition, the second wiring portion 833b is provided between a drain of the first NMOS transistor 870a and the second node 881b.

The deep N-type well 823 is connected to the drain of the first NMOS transistor 870a by the first wiring portion 833a and the second wiring portion 833b. Accordingly, the potential of the deep N-type well 823 is a potential which is identical to the drain potential Vd1 of the first NMOS transistor 870a.

In addition, as illustrated in FIG. 7A, the first NMOS transistor 870a has a configuration in which the drain and a gate are connected to each other. For this reason, being connected to the drain of the first NMOS transistor 870a corresponds to being connected to the gate. Accordingly, it can be described that the deep N-type well 823 is connected to the gate of the first NMOS transistor 870a, and the potential of the deep N-type well 823 is a potential which is identical to the gate potential Vg1 of the first NMOS transistor 870a.

Thus, the deep N-type well 823 is connected to the drain (the gate) of the first NMOS transistor 870a in four NMOS transistors, and is at a potential which is identical to the drain potential Vd1 (the gate potential Vd2). In the example illustrated in FIG. 7A, the first NMOS transistor 870a corresponds to a predetermined NMOS transistor in a plurality of NMOS transistors.

Note that, the drain of the first NMOS transistor 870a is connected to a source of the third NMOS transistor 870c. Accordingly, it can be described that the deep N-type well 823 is connected to the source of the third NMOS transistor 870c, and the potential of the deep N-type well 823 is a potential which is identical to the source potential Vs3 of the third NMOS transistor 870c. That is, in the example illustrated in FIG. 7A, it can be described that the third NMOS transistor 870c functions as a predetermined NMOS transistor.

The MOS circuit portion 820, for example, is operated such that a potential between the first NMOS transistor 870a and the third NMOS transistor 870c is approximately identical to a potential between the second NMOS transistor 870b and the fourth NMOS transistor 870d. Accordingly, the potential of the deep N-type well 823 is a potential greater than or equal to the potential of the P-type well which is provided in each of the NMOS transistors. Accordingly, it is possible to properly operate each of the NMOS transistors.

In such a configuration, the third NMOS transistor 870c functions as the first element portion 31, and the first NMOS transistor 870a functions as the second element portion 32. Accordingly, it is possible to sufficiently prevent the potential of the deep N-type well 823 from being greatly changed with respect to a variation in the power source voltage, and the like. As a result thereof, it is possible to improve the noise resistance of the device.

In addition, four NMOS transistors are provided in one deep N-type well 823, and thus, for example, it is possible to set the potential of the same deep N-type well 823 to a pair of NMOS transistors (for example, a pair of the first NMOS transistor 870a and the second NMOS transistor 870b). Accordingly, it is possible to easily stabilizing a circuit operation. In addition, for example, it is not necessary to form a plurality of deep N-type wells, and thus, it is not necessary to ensure a space and the like for separating the plurality of deep N-type wells from each other. As a result thereof, it is possible to decrease a layout area and the like of an element, and it is possible to configure a small device.

Similarly, in the electronic circuit 900 of the composite cascode connection illustrated in FIG. 7B, a first wiring portion 933a and a second wiring portion 933b (a stabilizing element portion 930) are provided. A deep N-type well 923 is connected to a drain of the first NMOS transistor 970a (a source of the third NMOS transistor 970c) by the first wiring portion 933a and the second wiring portion 933b. Accordingly, it is possible to sufficiently stabilize the potential of the deep N-type well 923, and it is possible to stably operate the circuit of the NMOS transistor (a MOS circuit portion 920).

Third Embodiment

Figure 8A:
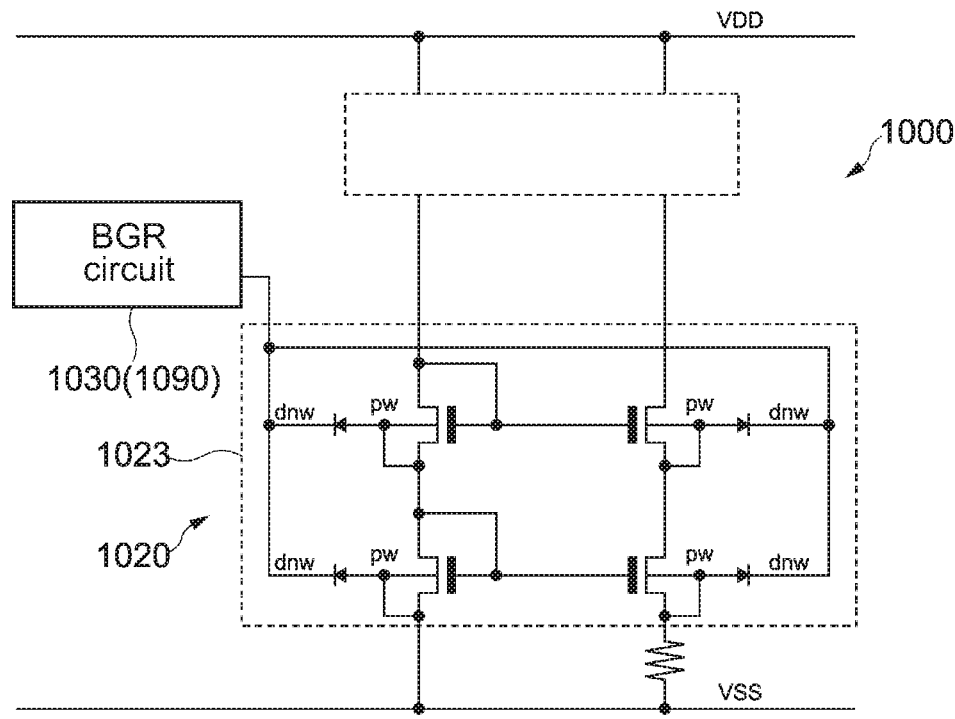
FIGS. 8A and 8B are circuit diagrams illustrating a configuration example of an electronic circuit according to a third embodiment.
Figure 8B:
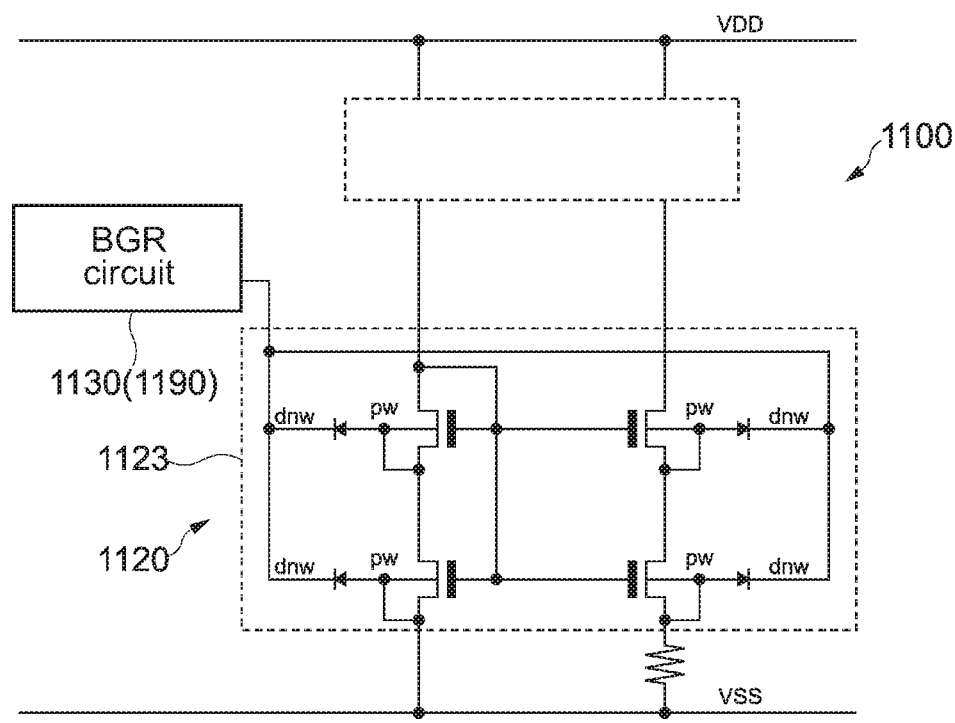

FIGS. 8A and 8B are diagrams illustrating configuration example of an electronic circuit according to a third embodiment. FIG. 8A is a circuit diagram of an electronic circuit 1000 including cascode-connected NMOS transistors. FIG. 8B is a circuit diagram of an electronic circuit 1100 including composite cascode-connected NMOS transistors.

The electronic circuit 1000 illustrated in FIG. 8A includes an MOS circuit portion 1020 which is approximately identical to the electronic circuit 300 illustrated in FIG. 4A. In the electronic circuit 1000, a band gap reference (BGR) circuit 1090 is used as a stabilizing element portion 1030.

The BGR circuit 1090, for example, is a circuit which generates a reference voltage such as a bandgap voltage (to 1.2 V) of silicon. The reference voltage which is generated by the BGR circuit 1090 is applied to a deep N-type well 1023. The configuration and the like of the BGR circuit 1090 are not limited, and for example, a general reference voltage generation circuit and the like which are mounted on an electronic device and the like are suitably used as the BGR circuit 1090. In this embodiment, the reference voltage which is generated by the BGR circuit 1090 corresponds to a predetermined voltage.

The electronic circuit 1100 illustrated in FIG. 8B includes an MOS circuit portion 1120 which is approximately identical to the electronic circuit 400 illustrated in FIG. 4B. In the electronic circuit 1100, a BGR circuit 1190 is used as a stabilizing element portion 1130. A reference voltage which is generated by the BGR circuit 1190 is applied to a deep N-type well 1123. The present technology can also be applied to the electronic circuit 1100 of the composite cascode connection.

Figure 9:
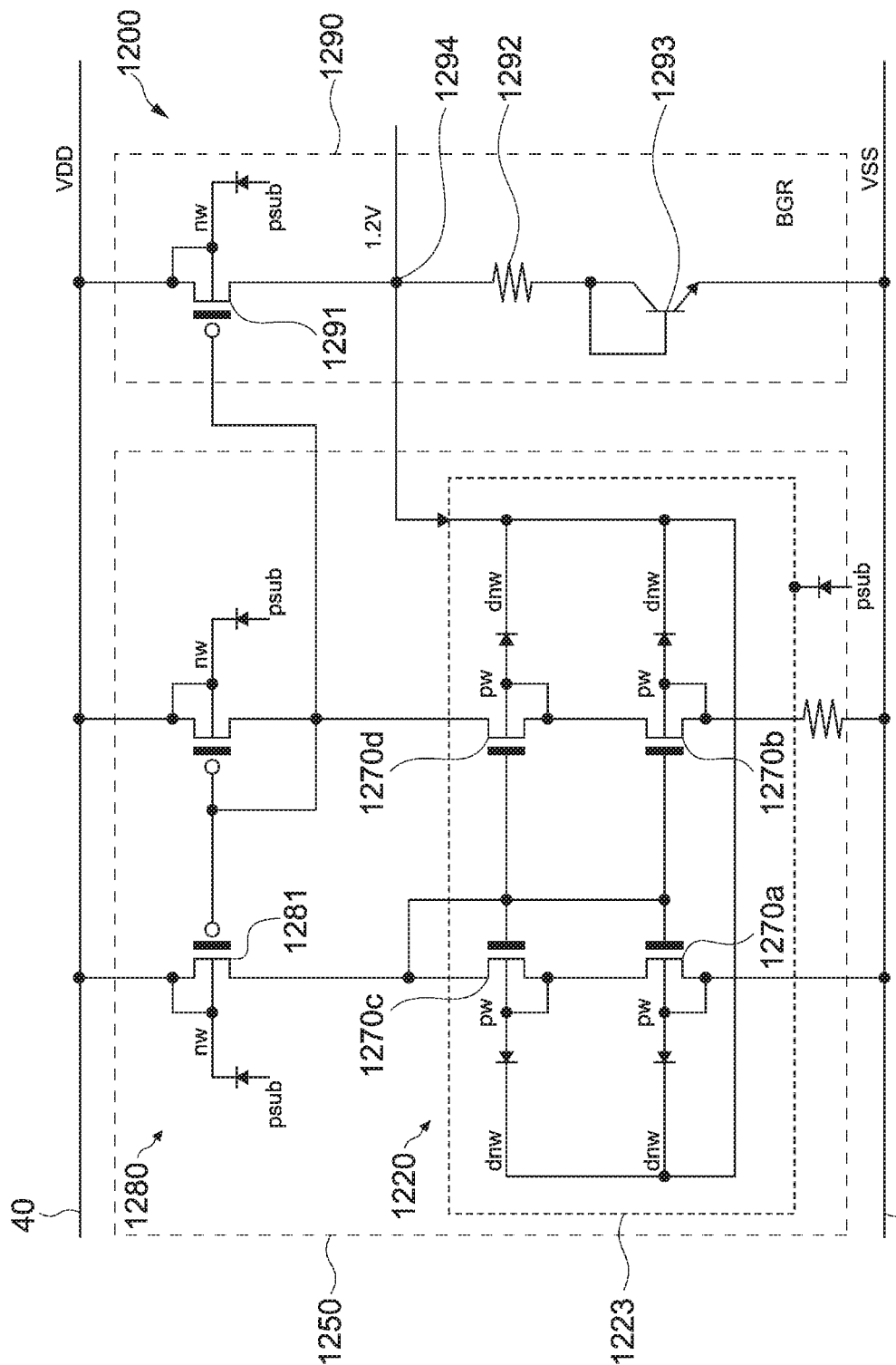
FIG. 9 is a diagram specifically illustrating one example at the time of applying a constant current circuit to the electronic circuit illustrated in FIG. 8B.

FIG. 9 is a diagram specifically illustrating one example at the time of applying a constant current circuit to the electronic circuit 1100 illustrated in FIG. 8B. An electronic circuit 1200 illustrated in FIG. 9 includes a constant current circuit 1250 and a BGR circuit 1290.

The constant current circuit 1250 has a configuration which is approximately to that of the electronic circuit 1100 illustrated in FIG. 8B, and includes an MOS circuit portion 1220 and a current circuit portion 1280. The current circuit portion 1280 is configured of two PMOS transistors 1281. The MOS circuit portion 1220 includes a first NMOS transistor 1270a to a fourth NMOS transistor 1270b which are composite cascode-connected.

The BGR circuit 1290 includes a PMOS transistor 1291, a resistance element 1292, a transistor 1293, and an output point 1294. The PMOS transistor 1291 functions as a current mirror circuit which copies a current flowing the current circuit portion 1280. A source (an upper side) of the PMOS transistor 1291 is connected to the power source 40, and a drain (a lower side) is connected to a collector of the transistor 1293 through the resistance element 1292. An emitter of the transistor 1293 is connected to the GND 50, and a base is connected to the collector. In FIG. 9, an NPN junction type bipolar transistor is used as the transistor 1293. In addition, the output point 1294 is provided between the PMOS transistor 1291 and the resistance element 1292.

In this embodiment, the PMOS transistor 1291 corresponds to the first element portion 31. In addition, the resistance element 1292 and the transistor 1293 correspond to the second element portion 32.

The BGR circuit 1290 outputs a bandgap voltage (to 1.2 V) of silicon to the output point 1294 as a reference voltage. The output point 1294 is connected to a deep N-type well 1223 in which the MOS circuit portion 1220 (a first NMOS transistor 1270a to a fourth NMOS transistor 1270b) is provided. Accordingly, the reference voltage is applied to the deep N-type well 1223.

The reference voltage, for example, is a voltage which is set in accordance with physical properties of silicon, and the like, and is a voltage which is stable with respect to a process voltage temperature (PVT) variation such as a process, a power source voltage, and a temperature. Accordingly, the reference voltage is applied to the deep N-type well 1223, and thus, it is possible to sufficiently stably retain the potential of the deep N-type well 1223. Accordingly, it is possible to sufficiently improve of the noise resistance of the device.

In addition, there is a case in which the BGR circuit and the like which generate the reference voltage are mounted in advance on the LSI circuit and the like. Accordingly, it is possible to easily stabilize the potential of the deep N-type well 1223 by using the BGR circuit which is embedded in advance. Accordingly, it is possible to suppress a manufacturing cost or to improve the efficiency of a design work.

Note that, the BGR circuit 1290 is not limited to the configuration illustrated in FIG. 9, and for example, an arbitrary circuit which is capable of generating the reference voltage may be used as the BGR circuit 1290. In addition, the value of the reference voltage is not also limited, and for example, the value of the reference voltage may be suitably set in accordance with the application or the properties of the MOS circuit portion 1220.

Fourth Embodiment

Figure 10A:
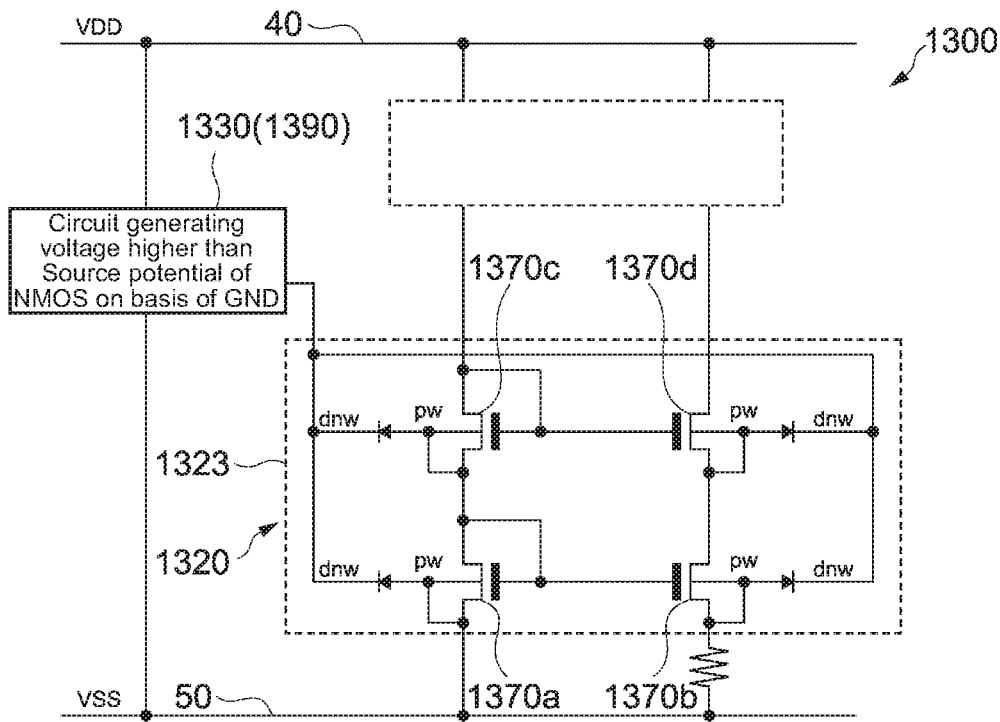
FIGS. 10A and 10B are circuit diagrams illustrating a configuration example of an electronic circuit according to a fourth embodiment.
Figure 10B:
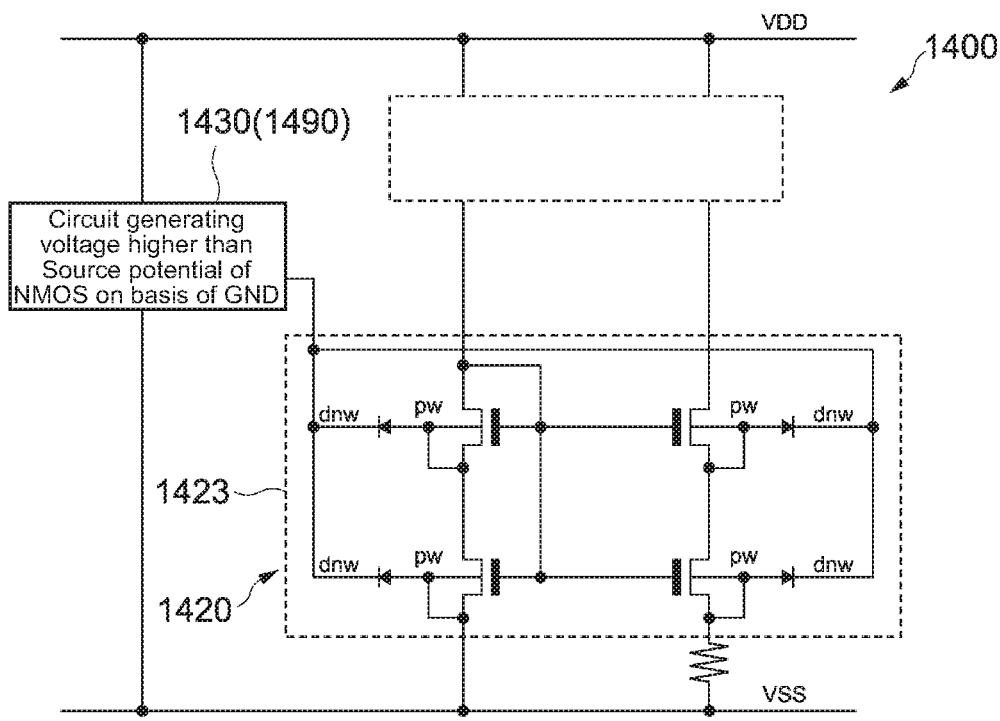

FIGS. 10A and 10B are circuit diagrams illustrating a configuration example of an electronic circuit according to a fourth embodiment. FIG. 10A is a circuit diagram of an electronic circuit 1300 including cascode-connected NMOS transistors. FIG. 10B is a circuit diagram of an electronic circuit 1400 including composite cascode-connected NMOS transistors.

The electronic circuit 1300 illustrated in FIG. 10A includes an MOS circuit portion 1320 which is approximately identical to the electronic circuit 300 illustrated in FIG. 4A. In the electronic circuit 1300, a voltage circuit 1390 is used as a stabilizing element portion 1330.

The voltage circuit 1390, for example, is a circuit which generates a voltage (an applied voltage) higher than a source potential of a first NMOS transistor 1370a to a fourth NMOS transistor 1370b, on the basis of the GND 50. The applied voltage which is generated by the voltage circuit 1390 is applied to a deep N-type well 1323.

The electronic circuit 1400 illustrated in FIG. 10B includes an MOS circuit portion 1420 which is approximately identical to the electronic circuit 400 illustrated in FIG. 4B. In the electronic circuit 1400, a voltage circuit 1490 is used as a stabilizing element portion 1430. An applied voltage which is generated by the voltage circuit 1490 is applied to a deep N-type well 1423. The present technology can also be applied to the electronic circuit 1400 of the composite cascode connection.

Figure 11:
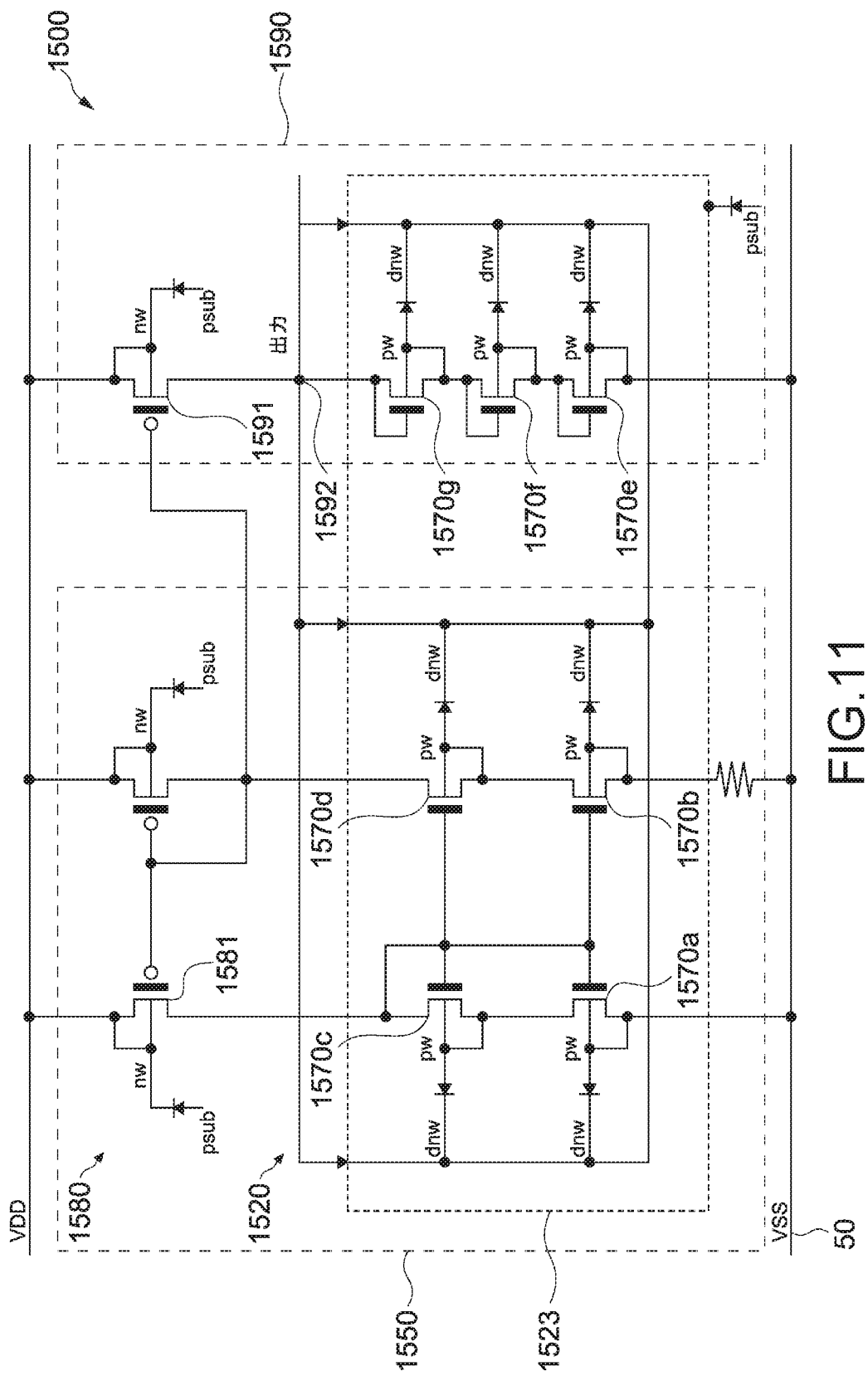
FIG. 11 is a diagram specifically illustrating one example at the time of applying a constant current circuit to the electronic circuit illustrated in FIG. 10B.

FIG. 11 is a diagram specifically illustrating one example at the time of applying a constant current circuit to the electronic circuit 1400 illustrated in FIG. 10B. An electronic circuit 1500 illustrated in FIG. 11 includes a constant current circuit 1550 and a voltage circuit 1590.

The constant current circuit 1550 has a configuration which is approximately identical to that of the electronic circuit 1400 illustrated in FIG. 10B, and includes an MOS circuit portion 1520 and a current circuit portion 1580. The current circuit portion 1580 is configured of two PMOS transistors 1581. The MOS circuit portion 1520 includes a first NMOS transistor 1570a to a fourth NMOS transistor 1570b which are composite cascode-connected.

The voltage circuit 1590 includes a PMOS transistor 1591, a fifth NMOS transistor 1570e to a seventh NMOS transistor 1570g, and an output point 1592. The PMOS transistor 1591 functions as a current mirror circuit which copies a current flowing the current circuit portion 1580.

The fifth NMOS transistor 1570e to the seventh NMOS transistor 1570g are formed on a deep N-type well 1523 in which the MOS circuit portion 1520 is formed. The fifth NMOS transistor 1570e to the seventh NMOS transistor 1570g respectively has a diode-connected configuration. A source of the fifth NMOS transistor 1570e is connected to the GND 50. A source of the sixth NMOS transistor 1570f is connected to a drain of the fifth NMOS transistor 1570e. A source of the seventh NMOS transistor 1570g is connected to a drain of the sixth NMOS transistor 1570f. In addition, a drain of the seventh NMOS transistor 1570g is connected to a drain of the PMOS transistor 1591 through the output point 1592. As illustrated in FIG. 11, the output point 1592 is connected to the deep N-type well 1523.

Note that, the voltage circuit 1590 is not limited to the configuration illustrated in FIG. 11, and for example, an arbitrary circuit which is capable of generating the applied voltage may be used as the voltage circuit 1590. In this embodiment, the PMOS transistor 1591 corresponds to the first element portion 31. In addition, the fifth NMOS transistor 1570e to the seventh NMOS transistor 1570g are capable of functioning as the second element portion 32.

In the voltage circuit 1590, the first NMOS transistor 1570a to the seventh NMOS transistor 1570g are provided on one deep N-type well 1523. That is, the deep N-type well 1523 is provided to cover a part of the MOS circuit portion 1520 and the voltage circuit 1590. P-type wells in which each of the NMOS transistors is formed are respectively connected to the deep N-type well 1523 through a PN junction diode.

In addition, in the voltage circuit 1590, the sum (Vgs5+Vgs6+Vgs7) of a gate voltage Vgs5 of the fifth NMOS transistor 1570e, a gate voltage Vgs6 of the sixth NMOS transistor 1570f, and a gate voltage Vgs7 of the seventh NMOS transistor 1570g is generated as the applied voltage. In addition, as illustrated in FIG. 11, the applied voltage is generated on the basis of the GND 50. In this embodiment, the applied voltage corresponds to a voltage based on the ground.

The voltage circuit 1590 is configured such that the value of the applied voltage is a value greater than that of the source potential of the first NMOS transistor 1570a to the seventh NMOS transistor 1570g. For example, a parameter such as the gate width W of the fifth NMOS transistor 1570e to the seventh NMOS transistor 1570g suitably set such that a desired applied voltage can be generated.

Here, a variation amount of the applied voltage will be described. A current (the drain current $I_D$) flowing the voltage circuit 1590 is supplied to the PMOS transistor 1591 which functions as a current mirror circuit. A value of several nanoampere orders is used as a current value, the fifth NMOS transistor 1570e to the seventh NMOS transistor 1570g are operated in a subthreshold region.

As described above, the drain current $I_D$ exponentially increases or decreases in accordance with a change in the gate voltage Vgs, but even in a case in which the drain current $I_D$ is changed, a change in the gate voltage Vgs is extremely small (refer to Math. 2). For example, a change in the gate voltage Vgs with respect to a change in the drain current $I_D$ can be calculated by using (Math. 3). When the drain current $I_D$ increase 10 times, a variation amount (an S parameter) of the gate voltage is calculated as follows.

$$S = \eta V_T ln(10) \qquad \text{[Math. 7]}$$

The S parameter is approximately 90 mV at a room temperature. This indicates that even in a case in which the drain current $I_D$ varies 10 times, the variation amount of the gate voltage Vgs is approximately 90 mV. A current variation in an actual constant current circuit and the like is several dozen %, and thus, the variation amount of the gate voltage Vgs sufficiently decreases.

Thus, a variation amount of the gate voltages Vgs5 to Vgs7 of the fifth NMOS transistor 1570a to the seventh NMOS transistor 1570g is suppressed to be sufficiently small with respect to a variation in the drain current $I_D$. Accordingly, for example, in a case in which the drain current $I_D$ supplied from PMOS transistor 1591 increases or decreases in accordance with a variation in the power source voltage, and the like, the voltage circuit 1590 is capable of stably generating the applied voltage. Note that, in this embodiment, the fifth NMOS transistor 1570*e* to the seventh NMOS transistor 1570*g* correspond to the NMOS transistor which is operated in the subthreshold region.

The applied voltage which is generated by the voltage circuit 1590 is applied to the deep N-type well 1523. Accordingly, the potential of the deep N-type well 1523 can be sufficiently stably retained. As a result thereof, it is possible to sufficiently improve the noise resistance of the device.

For example, even in a case in which BGR circuit and the like which generate the reference voltage are not provided, the applied voltage is generated on the basis of the GND 50 having a stable potential, and thus, it is possible to sufficiently stabilize the potential of the deep N-type well 1523. In addition, in the voltage circuit 1590, it is possible to arbitrarily set the value of the applied voltage in accordance with the properties, the application, and the like of a circuit to be a target, and for example, it is possible to considerably increase the degree of freedom of circuit design, and the like.

Other Embodiments

The present technology is not limited to the embodiments described above, and is capable of realizing various other embodiments.

In the embodiments described above, the NMOS transistor, the PMOS transistor, and the like are used as the first element portion. The present technology is not limited thereto, and the first element portion may be configured of any one or an arbitrary combination of a resistance, a capacitor, a transistor, and inductor. In addition, the second element portion may be configured of any one or an arbitrary combination of the resistance, the capacitor, the transistor, and the inductor.

For example, the resistance is used as the first element portion, and the capacitor is used as the second element portion, and thus, for example, it is possible to configure a filter (an RC filter) and the like cutting a high-frequency component and the like which are generated when the power source voltage is changed. Accordingly, it is possible to sufficiently stabilize the potential of the deep well. It is obvious that the present technology is not limited thereto, and for example, an arbitrary circuit such as a separator or an attenuator may be suitably used.

In addition, for example, the resistance and the like are used as the first element portion and the second element portion, and thus, it is possible to divide the power source voltage on the basis of the GND. Accordingly, even in a case in which the power source voltage varies, it is possible to stably retain the potential of the deep well, and it is possible to improve the operation accuracy of the device. In addition, the resistance, the capacitor, the transistor, the inductor, and the like are combined, and thus, an arbitrary circuit which stabilizes the potential of the deep well may be suitably configured.

Note that, the stabilizing element portion can be configured by only one of the first element portion and the second element portion. For example, the stabilizing element portion may have a configuration in which the resistance (the first element portion) is arranged between the deep well and the power source. In this case, for example, it is possible to decrease a variation amount of the potential of the deep well with respect to a variation in the power source voltage, in accordance with voltage depression and the like which occur due to the resistance. Accordingly, the resistance is used as the first element portion, and thus, the first element portion functions as a stabilizing element portion which stabilizes the potential of the deep well. Accordingly, it is possible to the noise resistance of the device.

In the above description, the deep N-type well is exemplified as the deep well. The present technology is not limited thereto, and the present technology can also be applied to other deep wells such as a deep P-type well.

It is also possible to combine at least two characteristic portions in the characteristic portions according to the present technology as described above. That is, various characteristic portions described in each of the embodiments may be arbitrarily combined without distinction of each of the embodiments. In addition, various effects described above are merely an example, and are not limited, and other effects may be exhibited.

Note that, the present technology can also be configured as follows.

(1) An electronic circuit, including: an MOS circuit portion including a deep well; and a stabilizing element portion including a first element portion arranged between a power supply source and the deep well and stabilizing a potential of the deep well.

(2) The electronic circuit according to (1), in which the MOS circuit portion includes a CMOS circuit which includes a deep N-type well.

(3) The electronic circuit according to (1) or (2), in which the MOS circuit portion is operated in a subthreshold region.

(4) The electronic circuit according to any one of (1) to (3), in which the electronic circuit is operated by a current approximately greater than or equal to 1 nA and less than or equal to 100 nA.

(5) The electronic circuit according to any one of (1) to (4), in which the stabilizing element portion applies a predetermined voltage to the deep well.

(6) The electronic circuit according to any one of (1) to (5), in which the first element portion includes any one or an arbitrary combination of a resistance, a capacitor, a transistor, and an inductor.

(7) The electronic circuit according to any one of (2) to (6), in which the MOS circuit portion includes a P-type substrate on which the deep N-type well is formed, and a P-type well which is electrically separated from the P-type substrate by the deep N-type well, and the stabilizing element portion retains a potential of the deep N-type well at a value greater than or equal to a potential of the P-type well.

(8) The electronic circuit according to (7), in which the MOS circuit portion includes an NMOS transistor which is formed in the P-type well, and the stabilizing element portion includes a wiring portion which connects the deep N-type well to any one of a gate, a source, and a drain of the NMOS transistor, and sets the potential of the deep N-type well to a potential identical to any one of a gate potential, a source potential, and a drain potential of the NMOS transistor.

(9) The electronic circuit according to (7), in which the MOS circuit portion includes a plurality of P-type wells which is electrically separated from the P-type substrate by the deep N-type well, and a plurality of NMOS transistors which is respectively formed in the plurality of P-type wells, and the stabilizing element portion includes a wiring portion which connects the deep N-type well to any one of a gate, a source, and a drain of a predetermined NMOS transistor in the plurality of NMOS transistors, and sets the potential of the deep N-type well to a potential identical to any one of a gate potential, a source potential, and a drain potential of the predetermined NMOS transistor.

(10) The electronic circuit according to any one of (1) to (7), in which the stabilizing element portion is a band gap reference (BGR) circuit.

(11) The electronic circuit according to any one of (1) to (7), in which the stabilizing element portion is a voltage circuit which generates a voltage based on a ground.

(12) The electronic circuit according to (11), in which the voltage circuit includes an NMOS transistor which is operated in a subthreshold region.

(13) The electronic circuit according to any one of (1) to (12), in which, the stabilizing element portion includes a second element portion which is arranged between a ground and the deep well.

REFERENCE SIGNS LIST 20, 220, 320, 520, 620, 720, 820, 920, 1020, 1120, 1220, 1320, 1420, 1520 MOS circuit portion
23, 223, 323, 823, 923, 1023, 1123, 1223, 1324, 1423, 1523 deep N-type well
523a, 623a, 723a first deep N-type well
523b, 623b, 723b second deep N-type well
30, 230, 330, 530, 630, 730, 830, 930, 1030, 1130, 1330, 1430 stabilizing element portion
31 first element portion
32 second element portion
40 power source
50 GND
70 NMOS transistor
270a, 370a, 470a, 570a, 670a, 770a, 870a, 970a, 1270a, 1370a, 1570a first NMOS transistor
270b, 370b, 470b, 570b, 670b, 770b, 870b, 970b, 1270b, 1370b, 1570b second NMOS transistor
370c, 470c, 570c, 670c, 770c, 870c, 970c, 1270c, 1370c, 1570c third NMOS transistor
370d, 470d, 570d, 670d, 770d, 870d, 970d, 1270d, 1370d, 1570d fourth NMOS transistor

The invention claimed is:

1. An electronic circuit, comprising:
an MOS circuit portion that comprises a deep well; and
a stabilizing element portion that comprises:
   a first element portion between a power supply source and the deep well; and
   a second element portion between a ground and the deep well, wherein
   the stabilizing element portion is configured to stabilize a potential of the deep well.

2. The electronic circuit according to claim 1, wherein the MOS circuit portion comprises a CMOS circuit which includes a deep N-type well.

3. The electronic circuit according to claim 1, wherein the MOS circuit portion is operated in a subthreshold region.

4. The electronic circuit according to claim 1, wherein the electronic circuit is operated by a current that is approximately greater than or equal to 1 nA and less than or equal to 100 nA.

5. The electronic circuit according to claim 1, wherein the stabilizing element portion is configured to apply a determined voltage to the deep well.

6. The electronic circuit according to claim 1, wherein the first element portion comprises at least one of a resistance, a capacitor, a transistor, or an inductor.

7. The electronic circuit according to claim 2, wherein the MOS circuit portion further comprises:
a P-type substrate, wherein the deep N-type well is on the P-type substrate; and
a P-type well which is electrically separated from the P-type substrate by the deep N-type well, wherein
the stabilizing element portion is configured to retain a potential of the deep N-type well at a value greater than or equal to a potential of the P-type well.

8. The electronic circuit according to claim 7, wherein
the MOS circuit portion includes comprises an NMOS transistor in the P-type well,
the stabilizing element portion comprises a wiring portion that connects the deep N-type well to one of a gate, a source, or a drain of the NMOS transistor, and
the stabilizing element portion is configured to set the potential of the deep N-type well to a potential identical to one of a gate potential, a source potential, or a drain potential of the NMOS transistor.

9. The electronic circuit according to claim 7, wherein the MOS circuit portion comprises:
a plurality of P-type wells which is electrically separated from the P-type substrate by the deep N-type well; and
a plurality of NMOS transistors which respectively correspond to the plurality of P-type wells,
the stabilizing element portion comprises a wiring portion which connects the deep N-type well to one of a gate, a source, or a drain of a determined NMOS transistor in the plurality of NMOS transistors, and
the stabilizing element portion is configured to set the potential of the deep N-type well to a potential identical to one of a gate potential, a source potential, or a drain potential of the determined NMOS transistor.

10. The electronic circuit according to claim 1, wherein the stabilizing element portion is a band gap reference (BGR) circuit.

11. The electronic circuit according to claim 1, wherein the stabilizing element portion is a voltage circuit which is configured to generate a voltage based on the ground.

12. The electronic circuit according to claim 11, wherein the voltage circuit comprises an NMOS transistor which is operated in a subthreshold region.

13. An electronic device, comprising:
a power supply source; and
an electronic circuit that comprises:
   an MOS circuit portion that comprises a deep well; and
   a stabilizing element portion that comprises:
      a first element portion between the power supply source and the deep well; and
      a second element portion between a ground and the deep well, wherein the stabilizing element portion is configured to stabilize a potential of the deep well.

14. An electronic circuit, comprising:
an MOS circuit portion that comprises a deep well; and
a stabilizing element portion that comprises a first element portion between a power supply source and the deep well, wherein
   the stabilizing element portion is configured to stabilize a potential of the deep well, and
   the stabilizing element portion is a band gap reference (BGR) circuit.

15. An electronic circuit, comprising:
an MOS circuit portion that comprises a deep well; and
a stabilizing element portion that comprises a first element portion between a power supply source and the deep well, wherein the stabilizing element portion is configured to stabilize a potential of the deep well, and the stabilizing element portion is a voltage circuit which is configured to generate a voltage based on a ground.

16. An electronic circuit, comprising:

an MOS circuit portion that comprises a deep well; and a stabilizing element portion that comprises a first element portion between a power supply source and the deep well, wherein the stabilizing element portion is configured to stabilize a potential of the deep well, and the electronic circuit is operated based on a current that is approximately greater than or equal to 1 nA and less than or equal to 100 nA.

* * * * *